United States Patent [19]

Satoh et al.

[11] Patent Number: 5,375,069
[45] Date of Patent: Dec. 20, 1994

[54] WIRING ROUTES IN A PLURALITY OF WIRING LAYERS

[75] Inventors: Yasuo Satoh; Takuji Itoh, both of Ohme, Japan

[73] Assignee: Hitachi, Ltd., Tokyo, Japan

[21] Appl. No.: 184,753

[22] Filed: Jan. 21, 1994

Related U.S. Application Data

[63] Continuation of Ser. No. 618,172, Nov. 26, 1990, abandoned.

[30] Foreign Application Priority Data

Dec. 19, 1989 [JP] Japan ............... 1-327746

[51] Int. Cl.$^5$ .............................. G06F 15/60
[52] U.S. Cl. ................... 364/490; 364/489; 364/488
[58] Field of Search .......... 364/486, 489, 490, 491

[56] References Cited

U.S. PATENT DOCUMENTS

| | | | |
|---|---|---|---|
| 4,752,887 | 6/1988 | Kuwahara | 364/491 |
| 4,805,113 | 2/1989 | Ishii et al. | 364/491 |
| 4,823,276 | 4/1989 | Hiwatashi | 364/491 |
| 4,855,929 | 8/1989 | Nakajima | 364/490 |
| 4,910,680 | 3/1990 | Hiwatashi | 364/491 |
| 5,046,017 | 9/1991 | Yuyama et al. | 364/491 |
| 5,072,402 | 12/1991 | Ashtaputre et al. | 364/491 |
| 5,119,317 | 6/1992 | Narikawa et al. | 364/491 |

OTHER PUBLICATIONS

"A New Routing Region Definition and Ordering Scheme Using L-Shape Channels" by Dai et al., IEEE Proceedings of ISCAS 1985, pp. 29-30.

*Primary Examiner*—Vincent N. Trans
*Attorney, Agent, or Firm*—Fay, Sharpe, Beall, Fagan, Minnich & McKee

[57] ABSTRACT

A wiring processing method for determining a wiring route for connecting terminals includes a step of dividing a wirable region into a plurality of rectangular regions in a virtual region corresponding to a chip, a step of searching a rectangular region for connecting the terminals to be wired by tracing mutually crossings rectangular regions, and a step of determining a detailed wiring route inside the searched rectangular region. Since the search is conducted by use of the rectangular region as a unit, high speed search can be made.

18 Claims, 20 Drawing Sheets

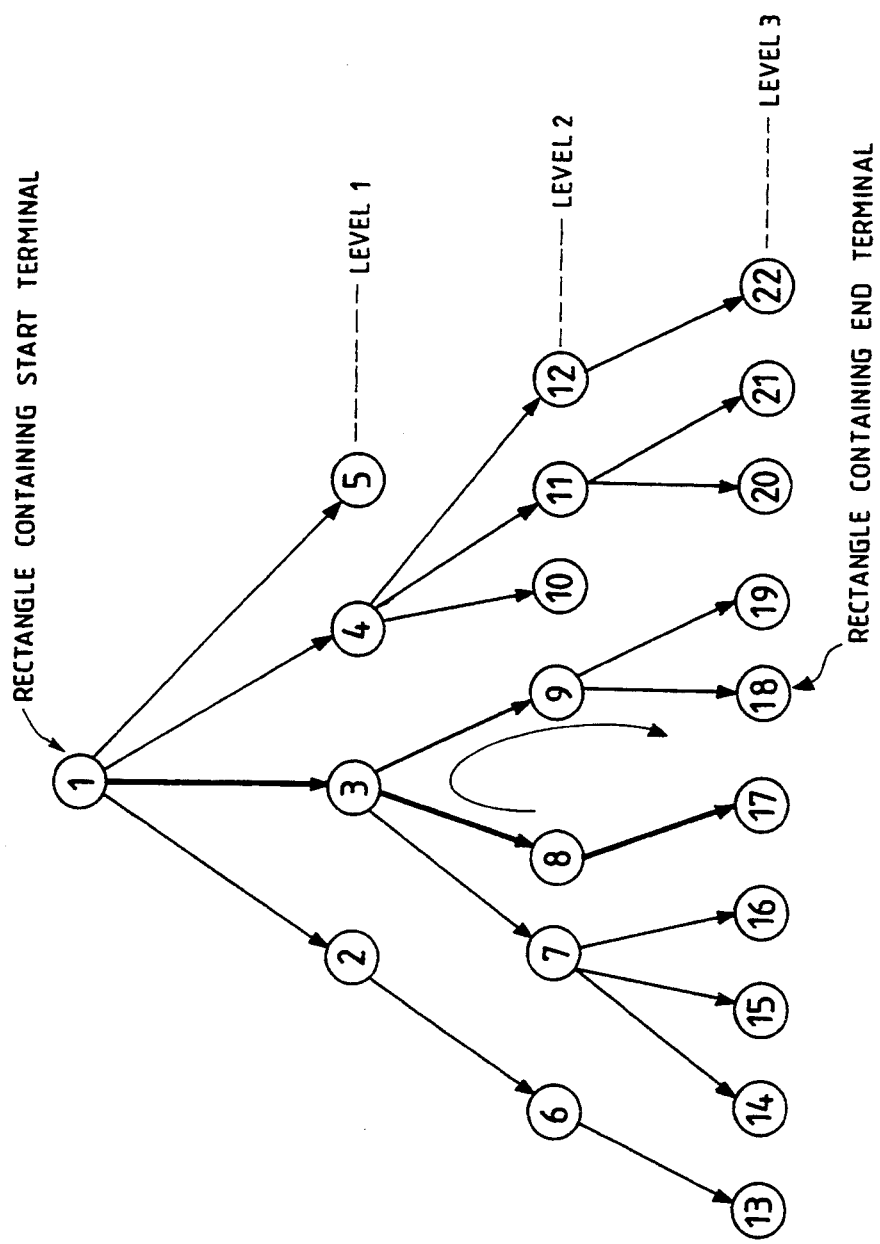

FIG. 14A
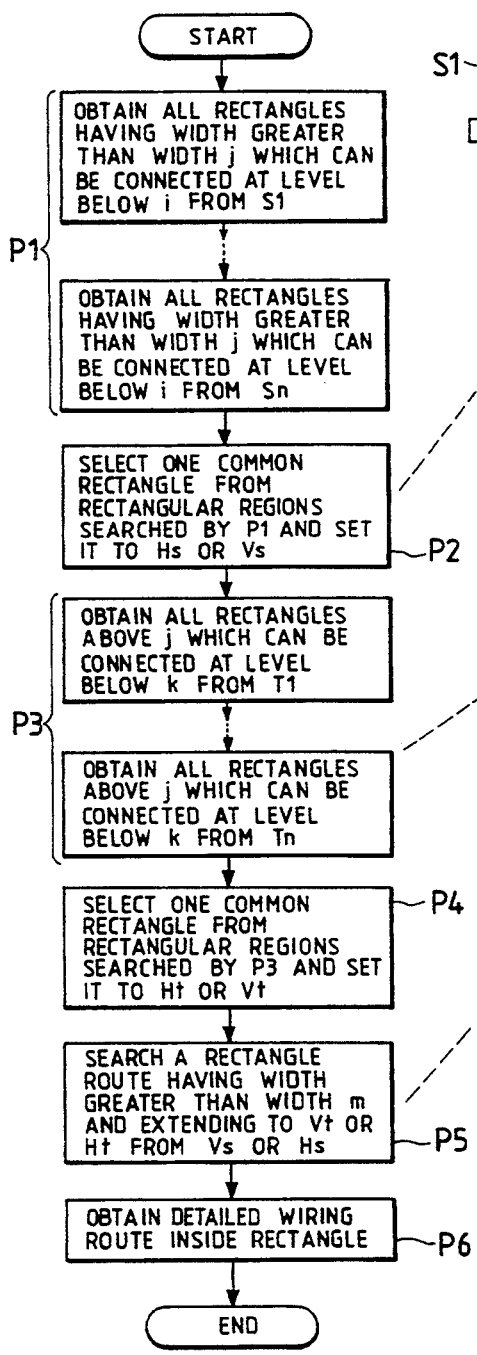
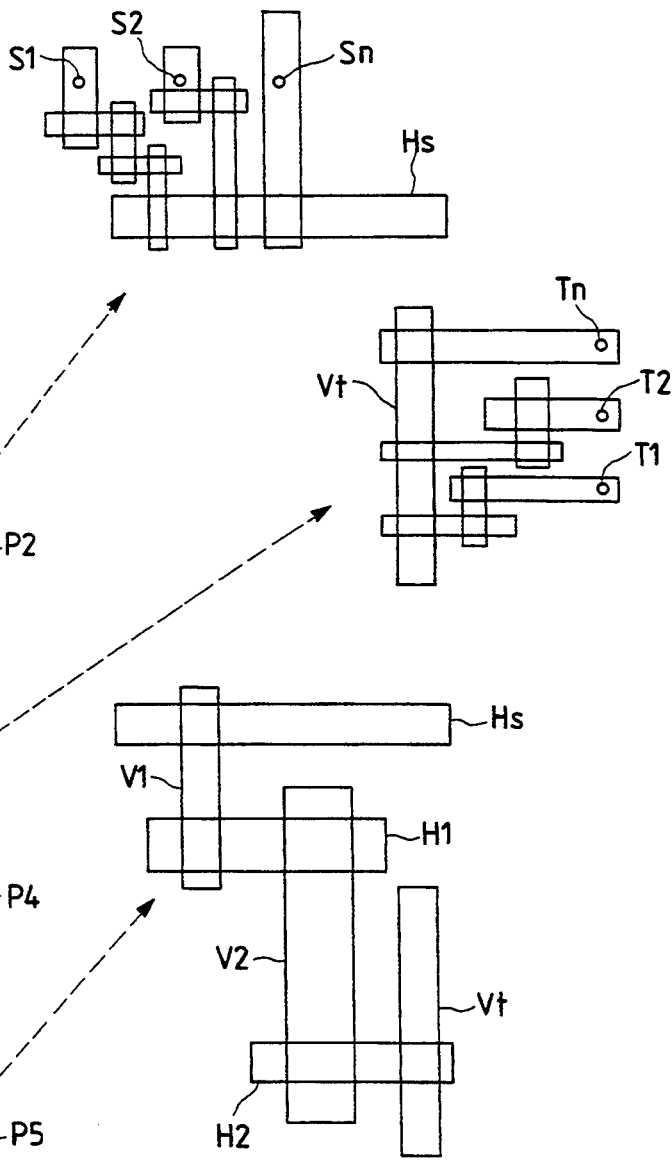

WIRING ROUTES IN A PLURALITY OF WIRING LAYERS

This is a continuation of U.S. application Ser. No. 07/618,172 filed Nov. 26, 1990 now abandoned.

BACKGROUND OF THE INVENTION

This invention relates to layout technique of wiring patterns or wiring routes in semiconductor integrated circuit devices such as gate arrays, standard cells, custom LSIs, and the like, and in wiring substrates.

Conventional methods that have been employed generally in automatic wiring design for semiconductor integrated circuit devices include a pattern limiting method, a maze routing method, a line search method and a channel assignment method as shown in FIG. 15 of the accompanying drawings.

The pattern limiting method makes connection between terminals in a predetermined pattern shape such as an L shape but its automatic wiring capability is low because available wiring patterns are limited. Therefore, this method can be applied to only rather simple wiring patterns.

The maze routing method is a method which controls wirability Of wirings on a wiring routing grid basis and searches a route from a start terminal to an end terminal by tracing wiring routing grids one by one in a predetermined direction. Since the search is made on a wiring routing grid basis in accordance with this maze routing method, its processing time increases and enormous work memory area is necessary for this search processing.

The line search method uses a line along a wiring routing grids as a unit of search and carries out the search while extending the lines in horizontal and vertical directions in such a manner as to bypass wiring inhibiting regions. Since the search is made on a line basis by this line search method, the processing time can be made shorter than in the maze routing method described above but there are inevitable limits to the reduction of the processing time and the work memory area.

The channel assignment method connects branches to a trunk on an inter-cell-column basis and can reduce the processing time but its handling is difficult for a chip model in which the wiring inhibiting regions are defined in a complicated manner. Moreover, this method cannot be applied easily to a multi-layer interconnection of three or more layers.

The logic scale of semiconductor integrated circuit devices is ever-increasing at present with a higher integration density and miniaturization of circuit elements in semiconductor integrated circuit devices and the demands for the reduction of the processing time and adaptability to multi-layered interconnection have been increasing in the automatic wiring processing. The following references can be cited as the prior art references relating to such demands.

(1) "Two-Layer Router Using Computational Geometric Means", (Data Processing Society, Design Automation 23-1, 19, Sep. 18, 1984)

(2) "Updating Method of Wiring Pattern in Gridless Router", (Electronic Communication Society, CAS84-131, Dec. 1, 1984)

(3) Japanese Patent Laid-Open No. 235683/1987

The methods described in the references (1) and (2) provide a two-layered wiring as an example, divide wirable regions on a chip into rectangles for each wiring layer, store a set of the sides of each divided rectangle as data, visualize graphically the crossing relations of the sides and determine the wiring route using the sides of the rectangles as the elements by making the search on this graph. For example, the wirable region in the first wiring layer shown in FIG. 16A is divided into rectangles and a graph is prepared by using the upper and lower sides a~l as the nodes (see FIG. 16D). The nodes on this graph are connected to one another by branch Only when the route using the second wiring layer exists between them. The wiring route extending from the start terminal S to the end terminal T is searched in accordance with this graph and its result is shown in FIG. 16C.

The method described in the reference (3) described above divides the wiring region and the wiring inhibiting region into rectangles and searches the route while changing dynamically the wiring sequence in accordance with the wiring regions and the shape of the net.

However, the studies conducted by the present inventor reveal that the following problems exist in the prior art technique described above. In accordance with the prior art technique of the references (1) and (2), the wiring route is searched by use of the sides of the rectangle as a unit. Accordingly, the wiring route is always bent at the edge of the wiring inhibiting region as shown in FIG. 16C. Therefore, the wiring route gets complicated and the number of through-holes increases, so that the yield of LSIs drops. For example, eight through-holes are necessary in the wiring route searched by this method as shown in FIG. 16C. However, there exists practically a wiring route having six through-holes as shown in FIG. 16E. In another example, there exists a wiring route RT2 having one through-hole and a wiring route RT1 having seven through-holes as shown in FIG. 16F. In such a case, a wiring route which minimizes the number of through-holes is employed preferably.

When the data necessary for the route search are stored in a graphic structure in a memory such as shown in FIG. 16D, the number of branches becomes enormous in a large-scale LSI and the memory capacity necessary for the work region of a computer becomes so great as to exceed the practical operational limit. Assuming, for example, an LSI having a memory capacity of 4 bytes for one branch, 200 branches for one node and a 100K gate scale, and assuming also that the number of nodes necessary for the LSI as a whole is 1000K; then, the memory capacity of the memory necessary for the work region becomes 800M bytes and this value by far exceeds the practical value.

In view of these problems, the prior art technique described in the reference (3) will not provide any technique exceeding the concept that the wiring route is searched by utilizing the rectangles.

SUMMARY OF THE INVENTION

It is an object of the present invention to provide a wiring route processing method and wiring route processing system which accomplishes any one of improvements in the wiring route search processing speed, compatibility to multi-layer interconnection structures, acquisition of a wiring route having a smaller number of bents and the memory capacity for the work region of a computer necessary for the wiring route search processing.

It is another object of the present invention to provide a semiconductor integrated circuit device having a simplified wiring routes, and hence having improved operational and structural reliability.

The above and other objects and novel features of the present invention will become more apparent from the following description of the specification when taken in conjunction with the accompanying drawings.

Among the inventions disclosed in this application, the typical inventions are briefly as follows.

Namely, a method for determining a wiring route for connecting terminals includes a step of dividing a wirable region into a plurality of rectangular regions, a step of searching a rectangular region for connecting the terminals robe wired by routing mutually crossing rectangular regions and a step of determining a detailed wiring route inside the searched rectangular region.

Particularly when a multi-layer interconnection is taken into consideration, the method of the present invention includes a step of dividing a wirable region into a plurality of rectangular regions for each wiring layer, a step of searching a rectangular region for connecting terminals to be wired by routing mutually crossing rectangular regions between adjacent wiring layers, and a step of determining a detailed wiring route inside the searched rectangular region.

In order to simplify the algorithm of processing in the wiring processing method described above and to further improve adaptability to diversification of the number of wiring layers, it is advisable to define the rectangular region as a horizontal rectangular region permitting wiring in a horizontal direction and a vertical rectangular region permitting wiring in a vertical direction.

To make distinct the processing rule when the rectangular regions cross one another at their respective boundary portions, it is advisable to expand a detailed wiring region in such a manner as to satisfy the adjacent layout rule of the wiring region when the detailed wiring region is determined inside the searched rectangular region, and to execute afresh the division step of the rectangular region using the expanded region as a wiring inhibiting region.

Particularly to reduce the number of bents of the wiring route and to improve the route search processing speed, the rectangular region search step preferably includes a step of calculating an evaluation value using the distance to an object terminal, the detour distance to the object terminal and the width of the rectangular region as the parameters when selecting another rectangular region crossing one rectangular region, and a step of judging an evaluation value involving a smaller distance to the object terminal, a smaller detour distance to the object terminal, and a greater width of the rectangular region to be more preferential, and selecting a rectangular region so that the object terminal can be reached by using preferentially a rectangular region having higher priority evaluation value.

To search efficiently a wiring route for wirings constituting a pair such as differential signal lines of a differential circuit or signal bus lines or in other words, to permit parallel search so as to make wiring lengths the same as much as possible among wiring routes of a plurality of nets, the condition that the rectangular region to be selected by the search must have a width greater than a predetermined width permitting juxtaposition of the wirings for connecting a plurality of sets of terminals should be included in the search conditions.

The wiring route processing system is constituted in such a manner as to provide physical wiring pattern data for connecting the necessary terminals by utilizing the techniques described above. For example, the system is constituted in such a manner as to output the physical wiring pattern data for connecting the terminals of circuit blocks by performing these processings; inputting at least the logical connection relation of the circuit block, the physical pattern disposition result of the circuit block determined on the basis of the logical connection relation and a layout rule of a semiconductor integrated circuit device, dividing a wirable region into a plurality of rectangular regions for each wiring layer on the basis of these input data, searching the rectangular region for connecting the terminals as the to be wired by routing crossing rectangular regions between mutually adjacent wiring layers and determining a detailed wiring route inside the searched rectangular region.

The semiconductor integrated circuit device is constituted by incorporating the physical wiring pattern formed by the wiring route processing system described above.

According to the means described above, the processing speed can be made higher by using the rectangles as a unit than by the route search using the routing grid or line as a unit.

To make search by routing the mutually crossing rectangular regions without considering the wiring routing grids in particular makes it possible to apply the present system to multi-layered interconnection without expanding particularly the algorithm.

The search for the rectangular region for connecting the object terminals by routing the crossing rectangular regions can be made by storing at least the data for specifying the rectangular region itself in main memory (inclusive of the work region) of the computer and the data corresponding to the branches representing the connection between the rectangular regions need not be stored, in particular. Accordingly, the memory capacity for the work region of the computer necessary for the route search processing can be reduced.

When the rectangular region is searched, priority of the evaluation taking the distance to the object terminals, the width of the rectangular region, etc, as the parameters into consideration is utilized in order to select the mutually crossing regions. This makes it easy to acquire the wiring having a small number of bents. Particularly when the width of the rectangular region is considered, parallel search processing of the wiring routes for a plurality of networks can be made.

BRIEF DESCRIPTION OF THE DRAWINGS

FIG. 9 is an explanatory view of a method for searching the rectangular regions by use of the evaluation values;

FIGS. 14A to 14C are explanatory views relating to a parallel wiring route determination method with respect to the bus signal lines;

DESCRIPTION OF THE PREFERRED EMBODIMENTS

Figure 1:
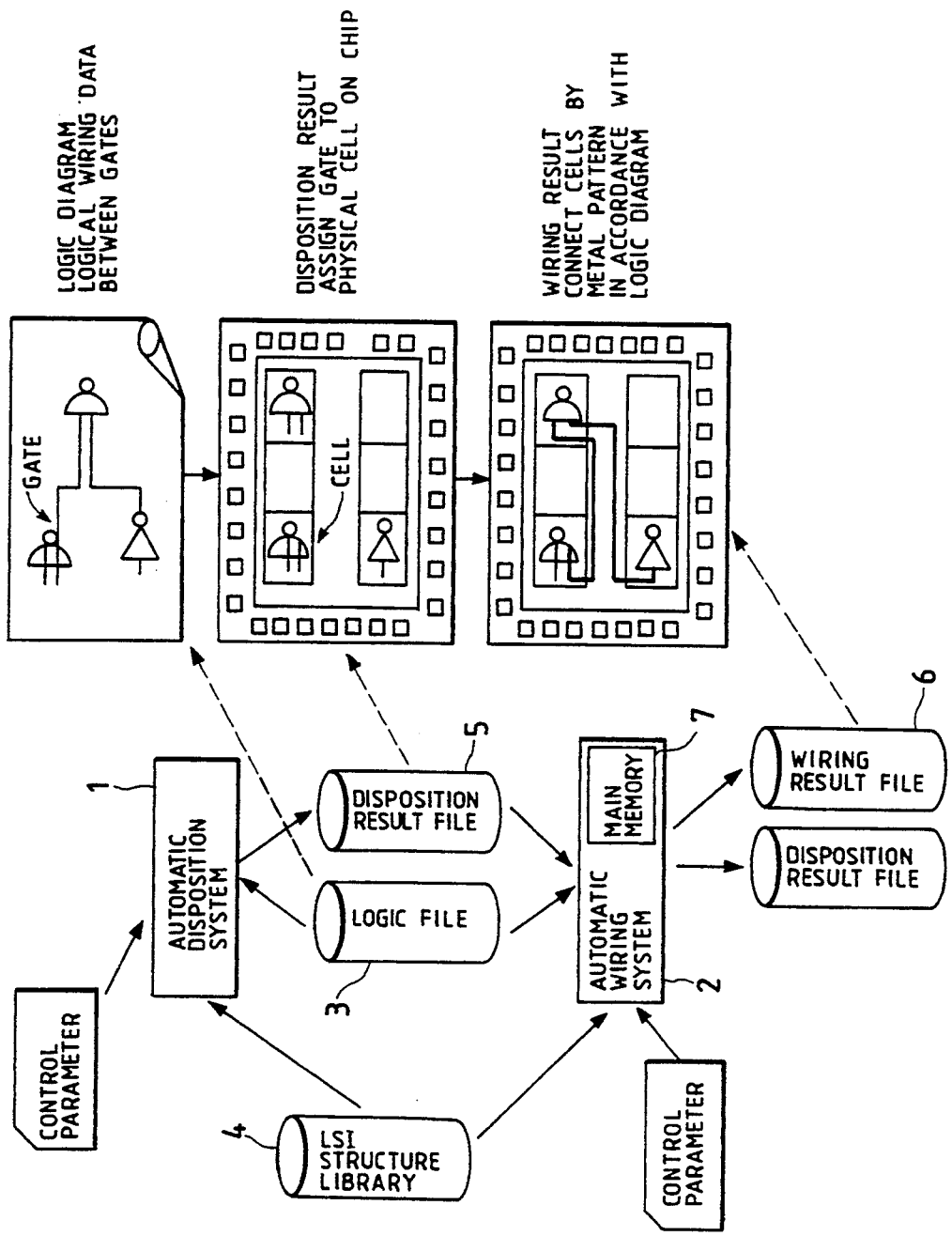
FIG. 1 is a system configuration diagram when the present invention is applied to automatic disposition wiring technique of a semiconductor integrated circuit device as an embodiment of the invention.

FIG. 1 shows an embodiment when the present invention is applied to an automatic disposition wiring technique of a semiconductor integrated circuit.

In the drawing, reference numeral 1 represents an automatic disposition system and reference numeral 2 does an automatic wiring system. Each of these systems has its own operation program and executes processing in accordance with the parameters inputted through a key or a card. Incidentally, though the automatic disposition system 1 and the automatic wiring system 2 are shown as different blocks, a work station or a computer as the hardware can be used in common.

Data of a logic file 3 and an LSI structure library 4 are provided to the automatic disposition system 1. The logic file 3 contains logic circuit diagram data such as logic gates, logical wiring data between the gates, etc, for constituting a semiconductor integrated circuit. The LSI structure library 4 contains the size of LSI, the cell shape, wiring inhibiting regions, layout rules and data on cell mountable regions that are necessary in advance in the case of gate arrays and standard cells.

The automatic disposition system 1 reads data of the logic file 3 and the LSI structure library 4 and assigns various gates for constituting a desired logical circuit in accordance with these data to cells on a virtual chip. This cell assignment result is stored in a disposition result file 5.

The automatic wiring system 2 reads the data of the disposition result file 5, the logic file 3 and the LSI structure library 4, searches the wiring routes between the cells in accordance with the data and stores the coordinates data in a wiring result file 6. The content of search processing of the wiring routes conducted in this automatic disposition system 2 will he described later in detail. It executes a processing for dividing a wirable region into a plurality of rectangular regions for each wiring layer on the basis of the input data such as from the disposition result file 5, a processing for searching the rectangular regions in order to connect the terminals as the object of wiring by routing the rectangular regions which cross between the mutually adjacent wiring layers, and a processing for determining the detailed wiring routes inside the rectangular region thus searched to obtain a physical wiring pattern for connecting the cells. The work regions necessary for data processing at this time are allocated to the entire part or part of a main memory 7.

Figure 2A:
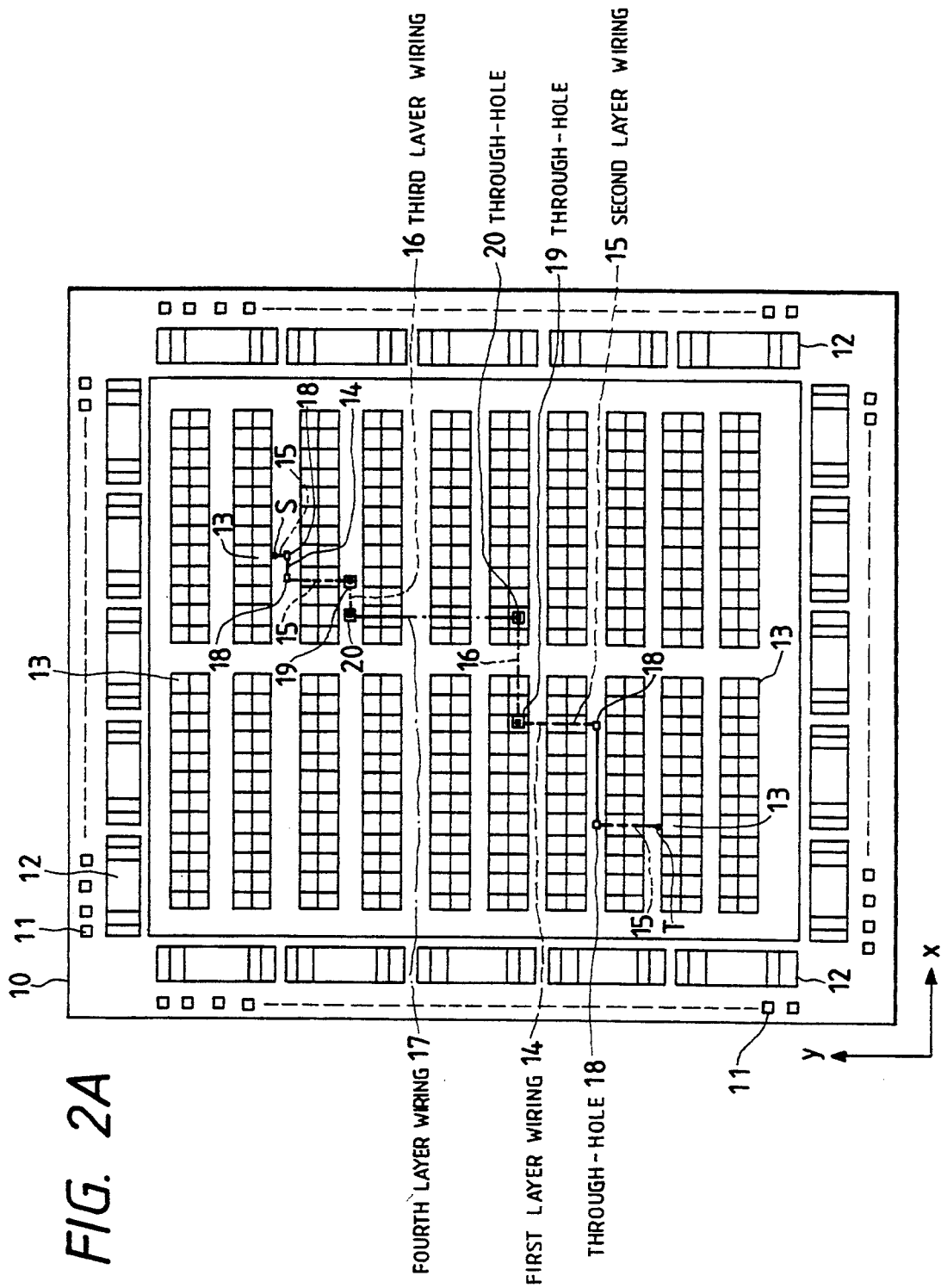
FIG. 2A is a schematic plan view of the semiconductor integrated circuit device having the disposition and wiring result obtained by the system shown in FIG. 1.

FIG. 2A is a plan view of a semiconductor integrated circuit device fabricated in accordance with the disposition wiring data obtained by the systems shown in FIG. 1.

In the drawing, reference numeral 10 represents a semiconductor substrate, and external electrodes 11 such as bonding pads or CCB pads and input/output buffer circuits 12 are disposed at the peripheral edge portions of its main plane. A large number of predetermined internal cells 13 are disposed at the center of the main plane. Though the internal cells 13 are shown disposed regularly in the columnar direction with predetermined width such as a gate array, the present invention is not particularly limited to this arrangement.

Though not particularly limitative, either, the semiconductor integrated circuit device shown in FIG. 2A has four wiring layers. In this drawing, the wiring extending from the terminal S of the internal cell 13 to its terminal T is shown typically. Reference numeral 14 represents the first wiring formed in the first wiring layer; 15 is the second wiring layer; 16 is the third wiring layer; and 17 is the fourth wiring layer. The terminals of the mutually adjacent wiring layers; are connected through through-holes 18, 19, 20. The first and third wiring layers 14, 16 are formed by a conductive pattern consisting of an aluminum layer or the like which extends mainly in an X direction and the second and fourth wiring layers 15, 17 are formed by a conductive pattern consisting of an aluminum layer, or the like, which extends mainly in a Y direction.

Figure 2B:
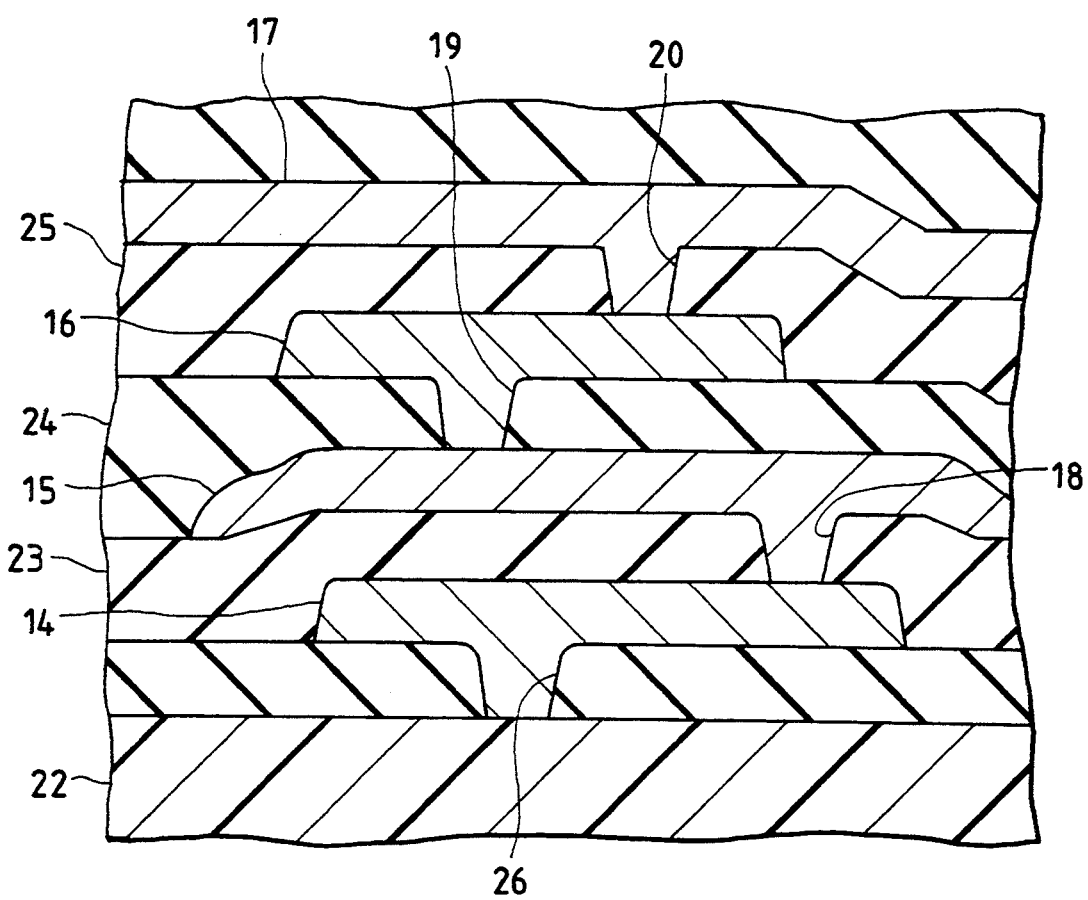
FIG. 2B is a sectional view showing exclusively the wiring layers in the semiconductor integrated circuit device of FIG. 2A.

FIG. 2B shows the sectional structure when the wiring layers of the semiconductor integrated circuit device shown in FIG. 2A are taken particularly into consideration. As shown in the drawing, the wiring layers 14 to 17 are insulated mutually by inter-level insulating films 23 to 25 and those wirings which are adjacent to one another through the inter-level insulating films are connected to one another through the through-holes 18 to 20 described above. Incidentally, reference numeral 22 represents the semiconductor substrate or a well region and the electrodes of circuit elements formed there are connected to the first wiring layer 14 through contact holes 26, for example.

Figure 3:
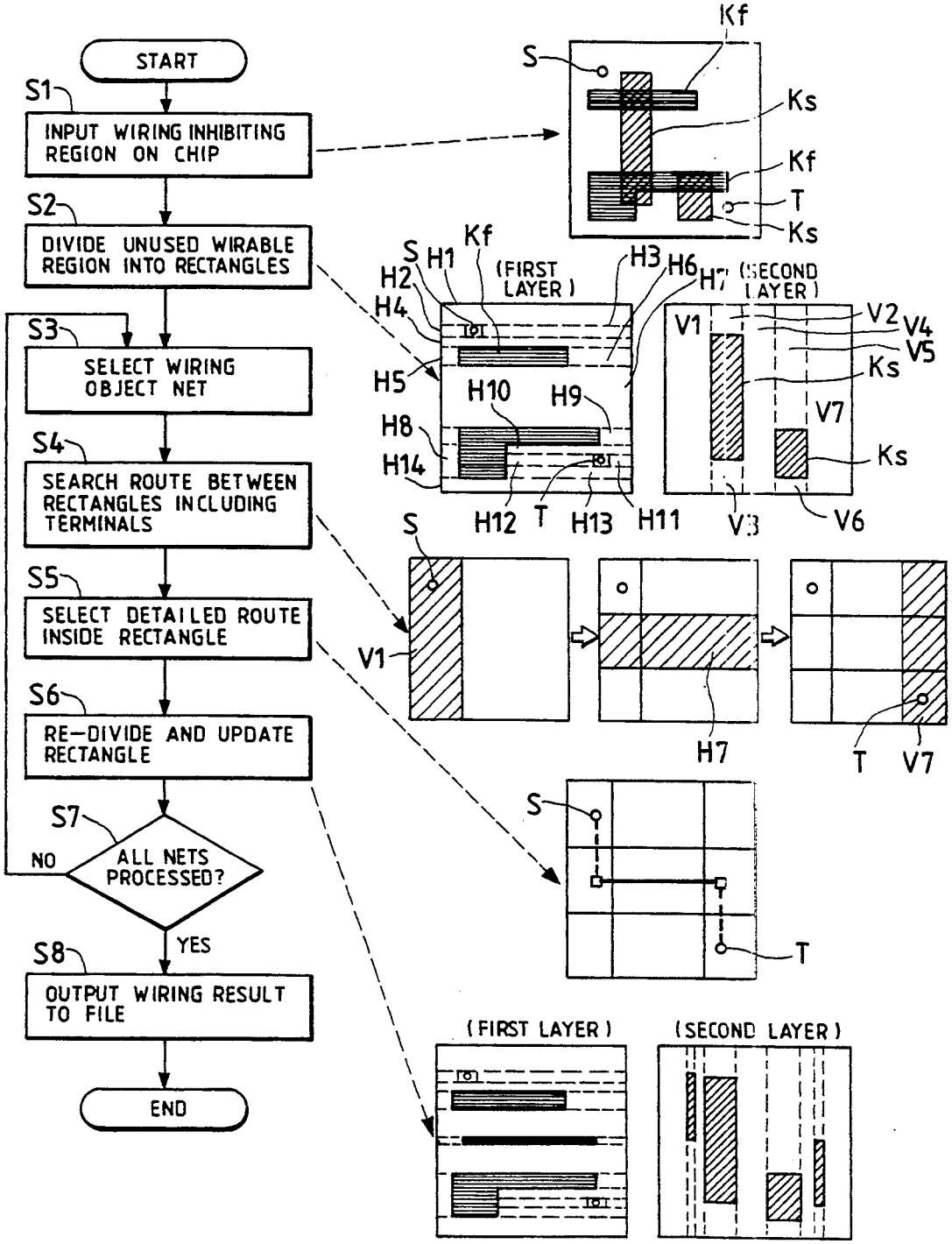
FIG. 3 is an explanatory view of wiring route processing in accordance with the present invention.

An example of the processing which is executed by the automatic wiring system 2 described above is carried out in the following sequence shown in FIG. 3. Incidentally, FIG. 3 shows an example of the case where the intended terminals are connected between two wiring layers.

① Step S1

The coordinates of the wiring inhibiting regions on a chip (a virtual region corresponding to the chip in practice) are calculated from the data of the LSI structure library 4 and the disposition result file 5 and are given to main memory 7. $K_f$ is the wiring inhibiting region of the first layer and $K_s$ is that of the second layer.

② Step S2

The balance obtained by subtracting the wiring inhibiting region from the wirable region or in other words, the chip region, is divided into a large number of rectangles. For example, the first layer which is wired in the horizontal direction is divided in the horizontal direction and the second layer which is wired in the vertical direction is divided in the vertical direction. Symbols H1~H14 represent the rectangular regions divided in the horizontal direction in the first layer and V1~V7 represent the rectangular regions divided in the vertical direction in the second layer.

③ Step S3

A wiring object net (a terminal pair to be connected) is selected. For example, a net consisting of the start terminal S and the end terminal T is selected.

④ Step S4

The route between the rectangular regions inclusive of the terminals as the wiring object net is searched at the level of rectangles. For example, a rectangular region V1 containing the start terminal S is searched and then the rectangular regions H7, V7 crossing the former are searched sequentially. Since the rectangular region V7 contains the end terminal T, the search of the rectangular regions is finished. Incidentally, the selection method of the rectangular regions will be explained later in further detail.

⑤ Step S5

Detailed wiring routes are determined inside the rectangular region obtained at the Step S4 in accordance with a predetermined rule such as a layout rule.

⑥ Step S6

Re-division or updating of the rectangular regions for the wirable region is made by regarding the region of the wiring route obtained at the step S5 as a new wiring inhibiting region.

⑦ Step S7

Whether or not the search processing of the wiring routes for all the wiring object nets is complete is judged. If the processing is not yet completed for all the object nets, the flow returns to the step S3 described above.

⑧ Step S8

When the processing for all the wiring object nets is completed at the step S7, the data of the determined wiring route is stored in the wiring result file 6.

Next, each of the processing contents described above will be explained in detail.

Figure 4A:
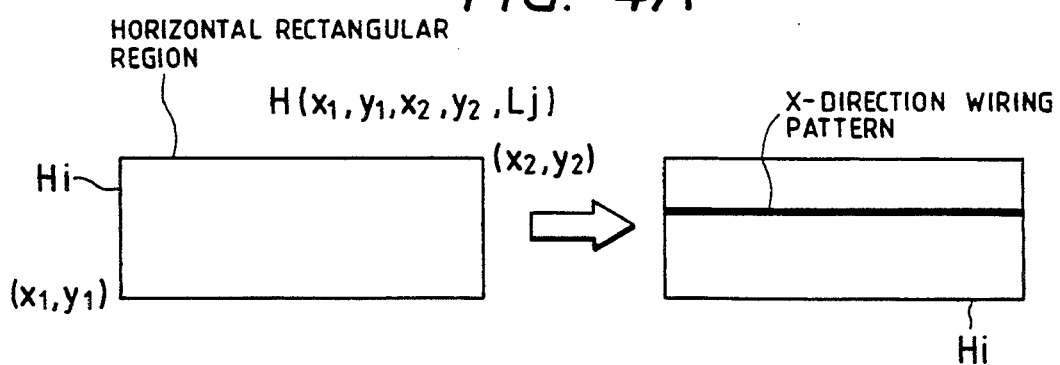
FIGS. 4A to 4C are explanatory views of definition relating to rectangular regions.

FIG. 4A shows a definition example of a horizontal rectangular region.

The horizontal rectangular region Hi (i=0 to n) is defined as $$Hi = H(x_1, y_1, x_2, y_2, L_j)$$

In other words, the horizontal region Hi has a shape having left lower coordinates $(x_1, y_1)$ and right upper coordinates $(x_2, y_2)$. This rectangular region Hi belongs to the wiring layer which is specified by Lj (wiring layer name). Inside this horizontal rectangular region Hi, a wiring pattern in the X direction (horizontal direction) can be formed arbitrarily.

Figure 4B:
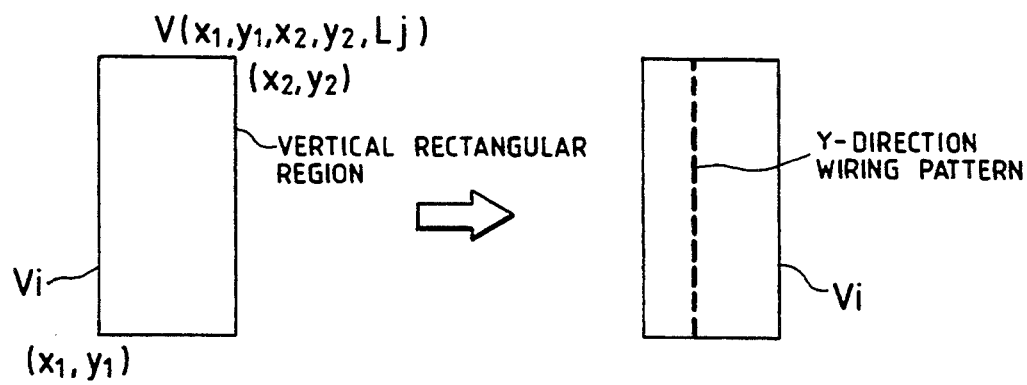

FIG. 4B shows a definition example of a vertical rectangular region.

The vertical rectangular region Vi (i=0 to n) is defined as $$Vi = V(x_1, y_1, x_2, y_2, L_j)$$

In other words, the rectangular region Vi has a shape which has left lower coordinates $(x_1, y_2)$ and right upper coordinates $(x_2, y_2)$. This rectangular region Vi belongs to the wiring layer which is specified by Lj (wiring layer name). Inside this vertical rectangular region Vi, a wiring pattern in the Y direction (vertical direction) can be formed arbitrarily.

Figure 4C:
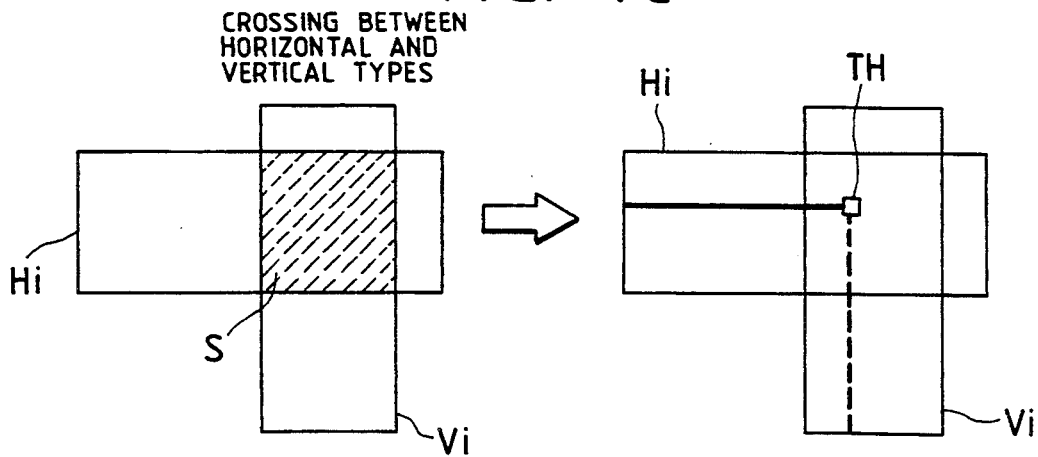

FIG. 4C shows a definition example of the crossing portion between the horizontal rectangular region Hi and the vertical rectangular region Vi.

When the horizontal rectangular region Hi and the vertical rectangular region Vi cross each other between the adjacent wiring layers, through-holes TH can be formed at arbitrary positions inside the crossing rectangular region S unless any specific limitation exists. Accordingly, the wirings in the X and Y directions are connected at each through-hole TH and a bent wiring route is formed.

Figure 5A:
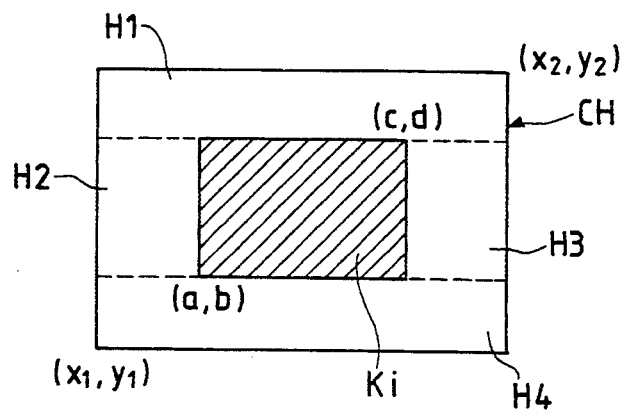
FIGS. 5A and 5B are explanatory views relating to a division method into rectangular regions.

FIG. 5A shows an example of the method which divided a virtual chip region into the rectangular regions described above. In the drawing, the wiring inhibiting region is only one and is represented by Ki for the purpose of simplification.

When the chip region CH is defined as $$CH = \{(x, y) | x_1 \leq x \leq x_2, y_1 \leq y \leq y_2\},$$

four horizontal rectangular regions H1, H2, H3, H4, which are defined below, are formed in a predetermined wiring layer (e.g. wiring layer in the horizontal direction) of the chip region CH:

$$H1 = \{(x,y) | x_1 \leq x \leq x_2, d \leq y \leq y_2\}$$

$$H2 = \{(x,y) | x_1 \leq x \leq a, b \leq y \leq d\}$$

$$H3 = \{(x,y) | c \leq x \leq x_2, b \leq y \leq d\}$$

$$H4 = \{(x,y) | x_1 \leq x \leq x_2, y_1 \leq y \leq b\}$$

Figure 5B:
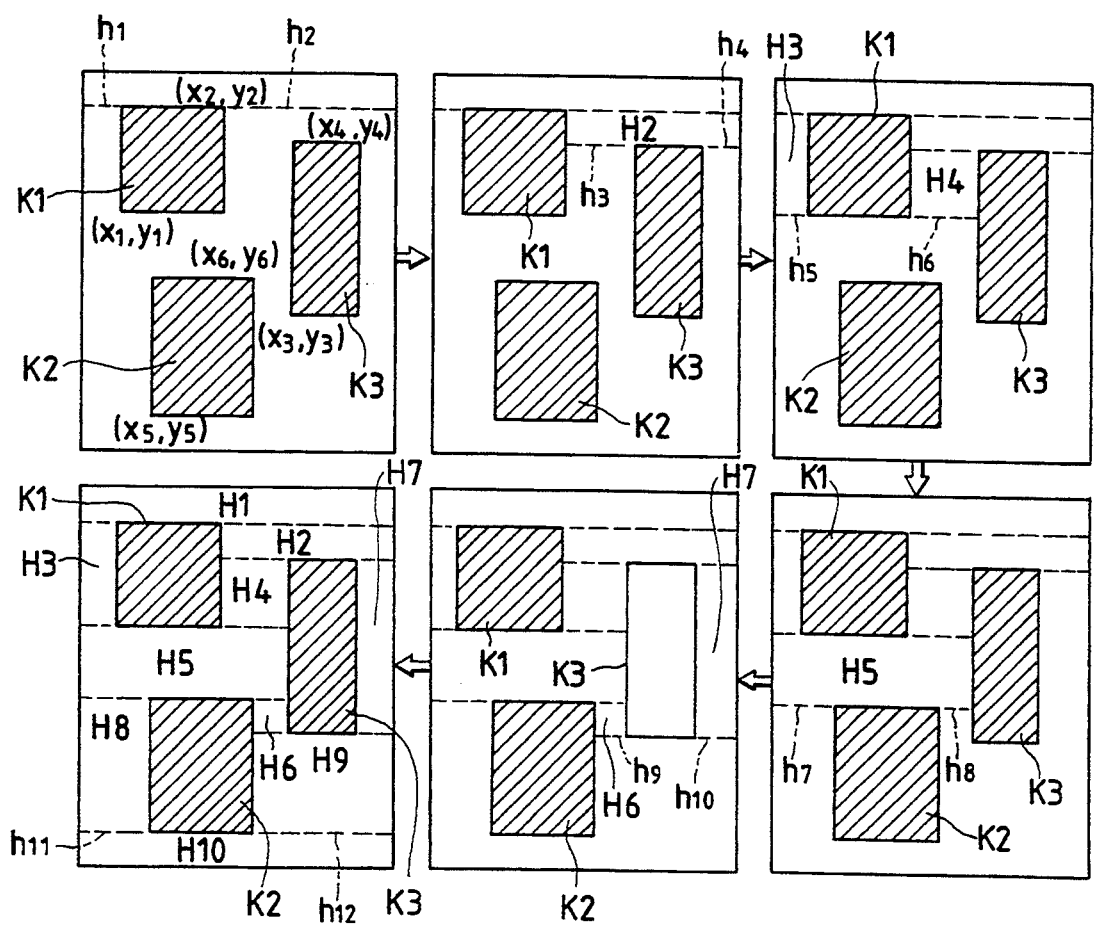

FIG. 5B shows an example of the method which divides a virtual chip region having a plurality of wiring inhibiting regions into the rectangular regions. In the drawing, K1 to K3 are the wiring inhibiting regions and the y coordinates $y_1$ to $y_6$ of the upper and lower sides of each region K1 to K3 can be listed as follows in the order of decreasing size:

$$y_2 > y_4 > y_1 > y_6 > y_3 > y_5$$

The following processings are carried out sequentially for these y coordinates in the order of decreasing size.

① A wiring inhibiting region having the y coordinates which is of interest is selected. If a plurality of wiring inhibiting regions having the same y coordinates exist, a wiring inhibiting region whose x coordinates is the smallest among the unprocessed regions is selected.

② Virtual straight lines hi are extended to the right and left of the selected wiring inhibiting region till they reach other wiring inhibiting regions. In this manner, the horizontal rectangular region is divided.

For example, the horizontal rectangular region H1 can be obtained by extending the lines $h_1$, $h_2$ from the coordinates $y_2$ and the horizontal rectangular region H2 can be obtained by extending the lines $h_3$, $h_4$ from the coordinates $y_4$. The wirable region can be divided into the horizontal rectangular regions $H_1$ to $H_{10}$ by repeating the same procedures as described above. In this case, the outside of the chip region is regarded as the wiring inhibiting region as can be understood from FIGS. 5A and 5B. The method of dividing the wirable region into the vertical rectangular regions is the same as the division method of the horizontal rectangular region described above, except that the x coordinates are used in place of the y coordinates.

Next, an example of the method of storing the definition data of the divided rectangular regions into the main memory 7 of the automatic wiring system 2 such as a computer will be explained. It will be generally sufficient if the coordinates and wiring layer names of the horizontal and vertical rectangular regions $H_i$, $V_i$ are stored onto a table in a predetermined sequence, but it is much more preferred if the arrangement is made so as to be capable of improving a route search processing speed at the rectangular levels. Therefore, its example will be explained.

Figure 6A:
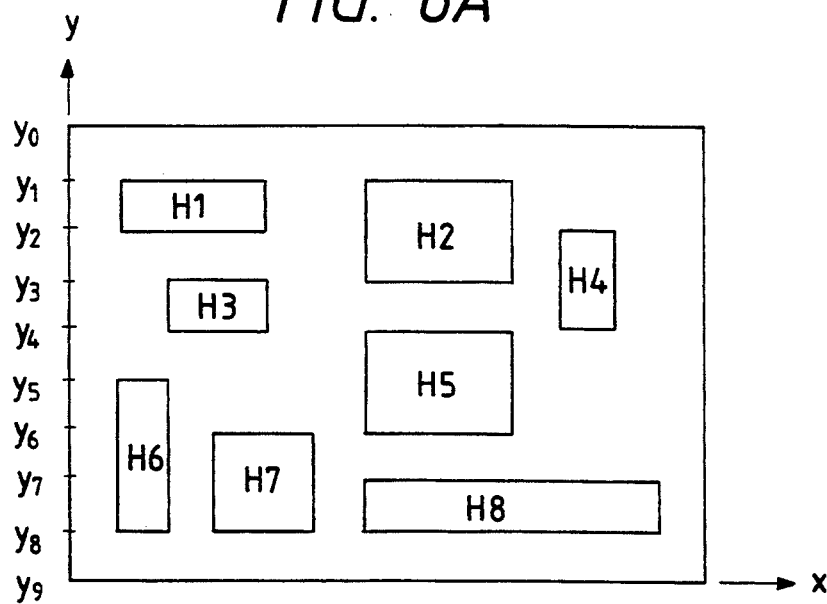
FIGS. 6A and 6B are explanatory views relating to memory means of rectangular region definition data.

FIG. 6A shows an example of the division of the horizontal rectangular regions in a predetermined wiring layer. According to this example, the region other than the wiring inhibiting regions is divided into eight horizontal rectangular regions H1 to H8 and the y coordinates are $y_0$ to $y_9$.

Figure 6B:
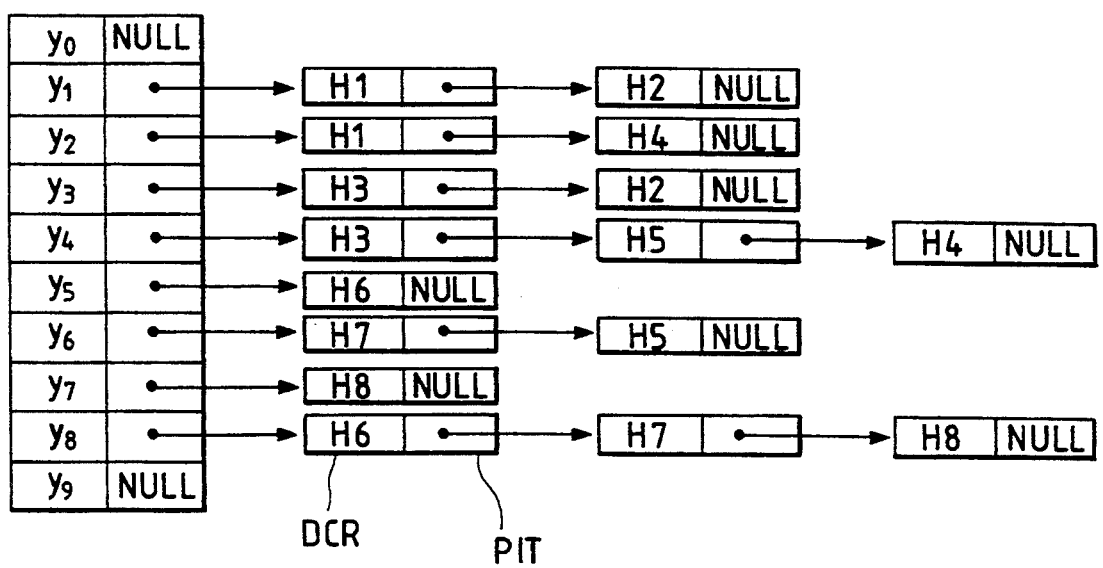
Figure 7A:
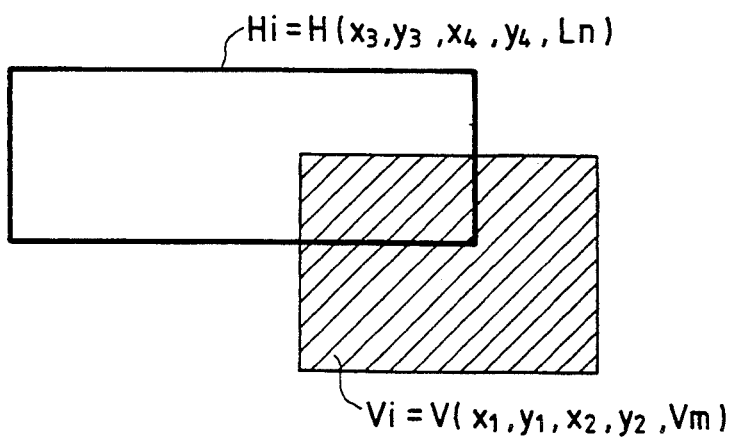
FIGS. 7A to 7D are explanatory views relating to the crossing conditions of the rectangular regions.
Figure 7B:
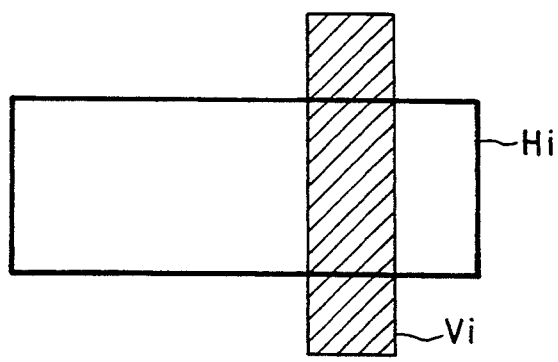
Figure 7C:
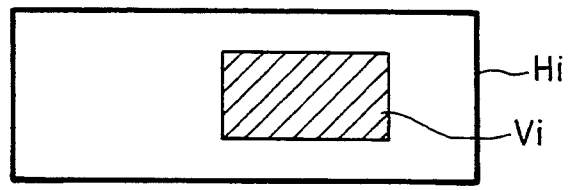
Figure 7D:
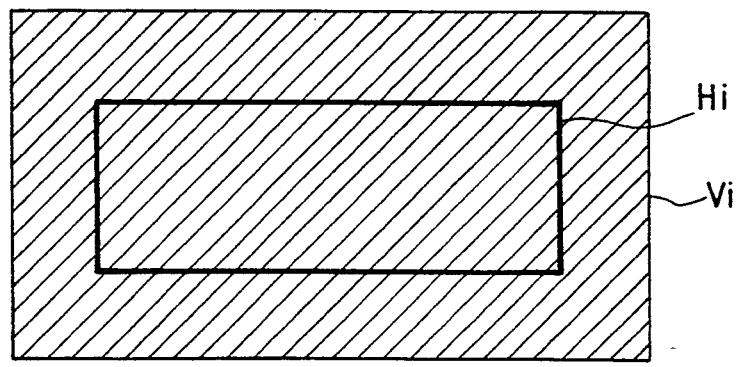

FIG. 6B shows an example of a definition data memory system of the rectangular regions H1 to H8 shown in FIG. 6A. The memory system shown in this drawing is generally referred to as the "list structure", in which the definition data of the rectangular region having the y coordinates as the boundary side can be traced with the y coordinates as a key sequentially (from the left) in the order of increasing x coordinates. For example, each data consists of a descriptor DCR and a pointer PIT, the descriptor of the key data has the value of the y coordinates and the address of the leading data chained to this descriptor is contained in its pointer. The descriptor of the data chained to the key data contains the definition data of the rectangular regions and its pointer contains the address of the data to be next chained. For example, the pointer of the key data having the data $y_4$ in the descriptor chains to the next data having the definition data of the rectangular region H3 in the descriptor and then sequentially, the data having the definition data of the rectangular region H5 and the data having the definition data of the rectangular region H4 are chained.

Incidentally, the list structure described above is formed for each of the wiring layers. It is also possible to use a list structure which uses the value of the x coordinates instead of the y coordinates as the key. Symbol NULL contained in the pointer means the end of the chain data or means that the chain does not exist.

FIGS. 7A to 7D show the examples of crossing conditions between the vertical rectangular regions and the horizontal rectangular regions at the time of the route search at the rectangular level.

For the vertical rectangular regions $V_i = V (x_1, y_1, x_2, y_2, Lm)$ and the horizontal rectangular regions $H_i = H (x_3, y_3, x_4, y_4, Ln)$ to cross one another in accordance with this embodiment, all the following conditions (1) to (3) must be satisfied:

$$Ln = Lm + 1 \text{ or } Lm = Ln + 1 \qquad (1)$$

$$[x_1, x_2] \cap [x_3, x_4] \neq 0 \qquad (2)$$

$$[y_1, y_2] \cap [y_3, y_4] \neq 0 \qquad (3)$$

In other words, it is possible to say that the vertical rectangular regions $V_i$ and the horizontal rectangular regions $H_i$ cross one another if they are in partial or total inclusion relation or are superposed one upon another even slightly at part of their sides or points.

Figure 8A:
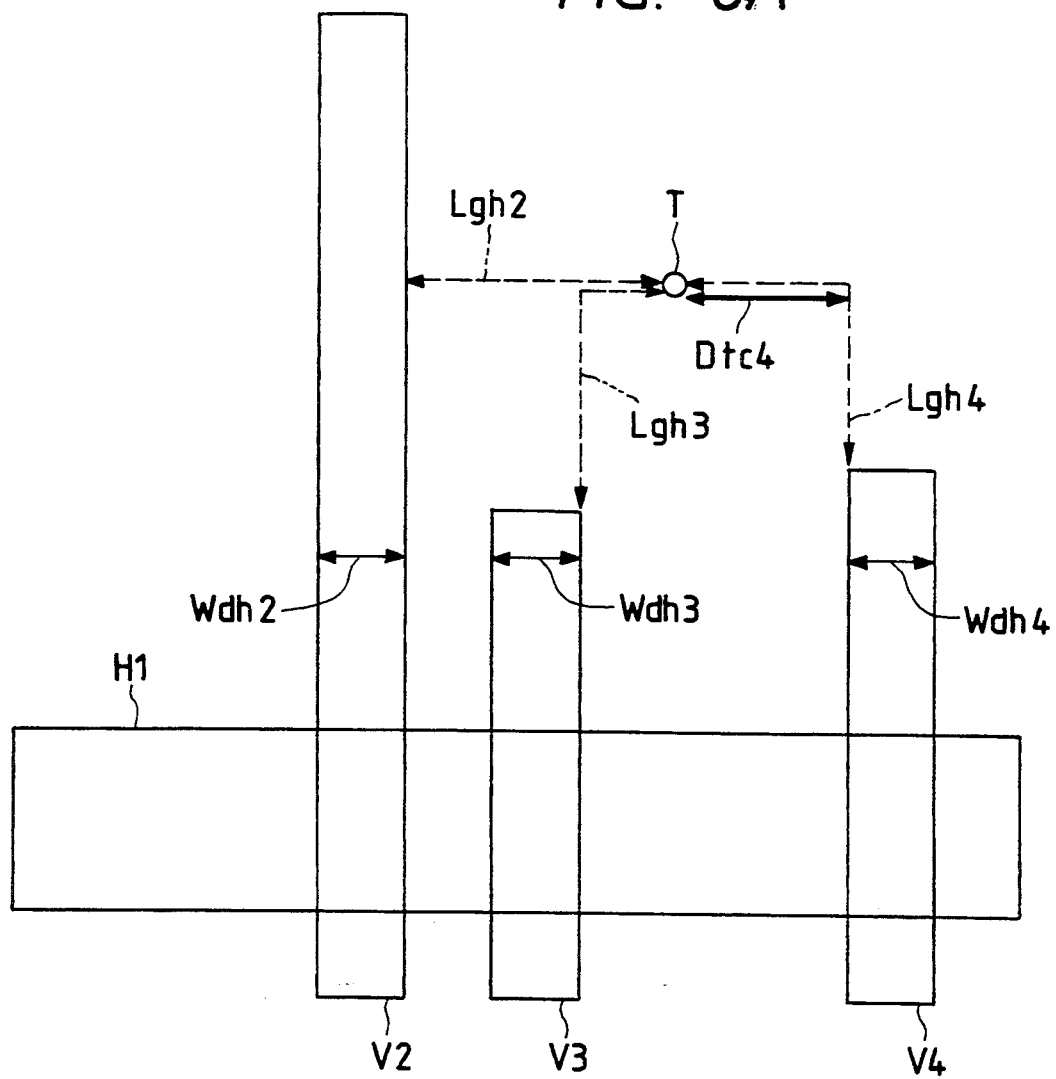
FIGS. 8A and 8B are explanatory views relating to evaluation values for the route search at the rectangular levels.
Figure 8B:
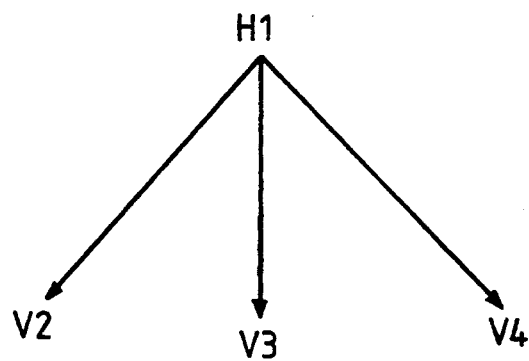

FIGS. 8A and 8B show an example of the route search method at the rectangular level.

In FIG. 8A, H1 represents the horizontal rectangular region which is searched sequentially starting at the start terminal S in the processing at the step S4 in FIG. 3. FIG. 8A shows an example of the processing which searches further a rectangular region from that rectangular region H1 towards the end terminal T.

In FIG. 8A, three kinds of vertical rectangular regions V2, V3, V4, that cross the horizontal rectangular region H1, exist. Their mutual position relation is represented by directed flags such as shown in FIG. 8B. Judgement to select which region among the rectangular regions V2, V3, V4 crossing the horizontal rectangular region H1 is made in the following way. Namely, the evaluation value G using the distance Lghi to the end terminal T as the target point, the detour distance Dtci to the end terminal T and the width Wdhi of the rectangular region as the parameters is calculated for each of the rectangular regions V2, V3, V4 as expressed by the following formulas:

$$G = f(Lghi, Dtci, Wdhi, etc)$$

$$G = \alpha Lghi + \beta Dtci - \gamma Wdhi$$

(where $\alpha$, $\beta$ and $\gamma$ are constants and are $> 0$.

Thus, there are calculated the following evaluation values:

G2 = f (Lgh2, 0, Wdh2) ... evaluation value of rectangular region V2

G3 = f (Lgh3, 0, Wdh3) ... evaluation of rectangular region V3

G4 = f (Lgh4, Dtc4, Wdh4) ... evaluation value of rectangular region V4

The rectangular region corresponding to the smallest value among the evaluation values described above is selected. Here, as is obvious from the general formulas of the evaluation values described above, the evaluation value involving a smaller distance Lghi to the object terminal, a smaller detour distance Dtci and a greater width Wdhi of the rectangular region as parameters is judged to be more preferential. The reduction of the wiring length and the number of bent wirings can be easily accomplished by use of such an evaluation value. The length of the rectangular region can be included in parameters when cross-talk and wiring resistance are taken into consideration.

FIG. 9 shows graphically an example of the method of searching the route of the rectangular regions by use of the evaluation values obtained by the method shown in FIG. 8A.

In the drawing, numerals inside the circles meaning nodes are serial numbers of the rectangular regions. The node 1 represents the rectangular region including the start terminal and the mutually crossing nodes are connected by a branch. The level number means the number of bents to the rectangular region when the rectangular region containing the start terminal is used as the reference.

It will be assumed hereby that the evaluation values at the levels have the following relation when the evaluation value of the rectangular region of the number n is Gn, for example:

level 1: G3<G2<G4<G5 . . .
level 2: G8<G9<G7<. . .
level 3: G18<G19<. . .

Then the node G3 having the smallest evaluation value at the level 1 is selected with the rectangular region containing the start terminal S as the start point, the node G8 having the smallest evaluation value among the nodes connected to the node 3 by the branches is selected and the node 17 is reached. Since the rectangular region of this node 17 does not contain the end terminal, the flow returns to the node 3 having the branches and the node 9 having the second lowest evaluation value after the node 8 is selected. At this node 9, the node 18 having a relatively small evaluation value is selected. Since this node 18 contains the end terminal, the search at the rectangular region level is finished. The sequence of search can be expressed in the simple form of 1→3→8→17→9→18 in terms of node representation and the rectangular region ranging from the start terminal to the end terminal can be searched effectively.

Figure 10A:
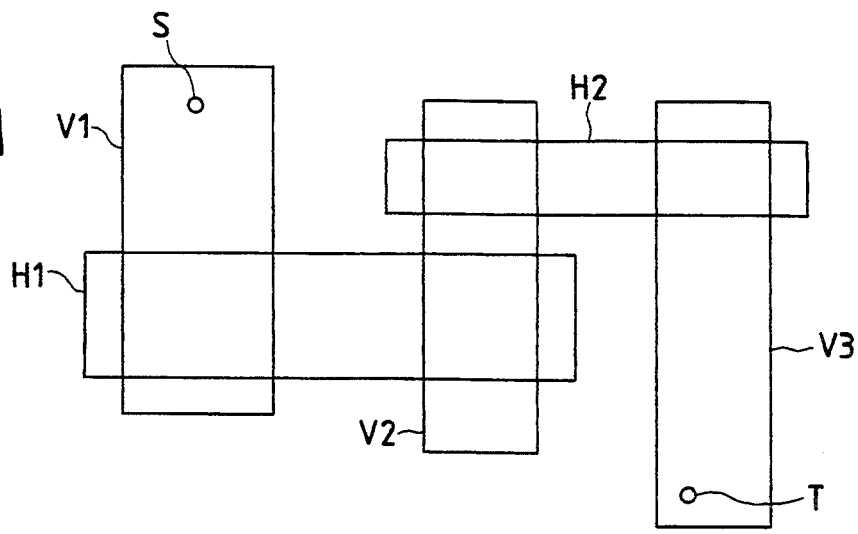
FIGS. 10A to 10C are explanatory views relating to a detailed wiring route determination method inside the rectangular regions.
Figure 10B:
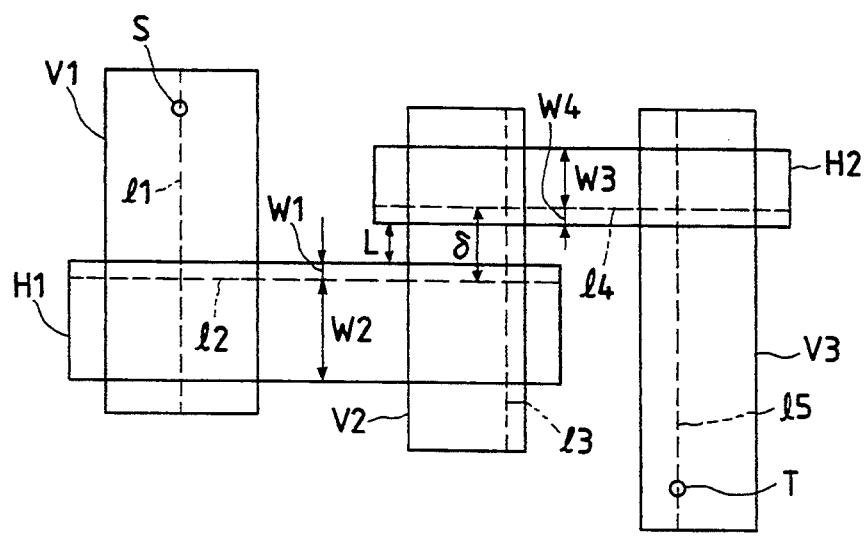
Figure 10C:
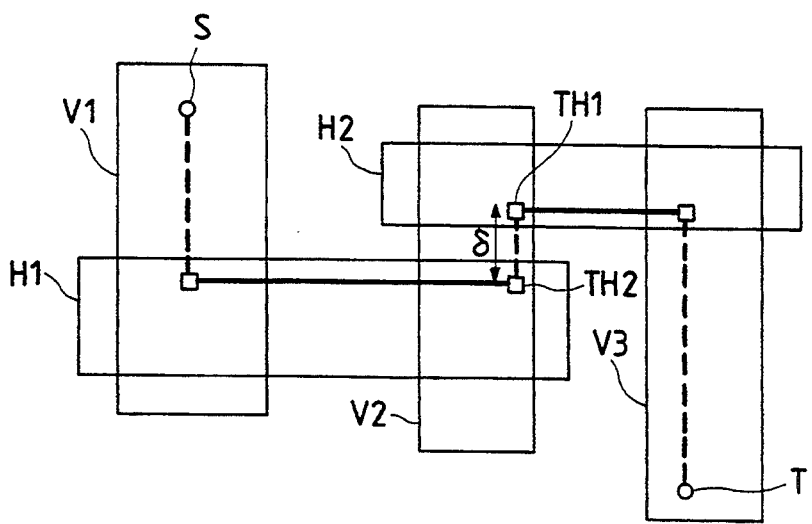

FIGS. 10A to 10C show an example of the method of determining the detailed wiring route inside the rectangle thus searched.

FIG. 10A shows the search result of the rectangular region from the start terminal S to the end terminal T by the method described already. According to this diagram, the rectangles selected by the search are the horizontal rectangular regions H1, H2 and the vertical rectangular regions V1, V2, V3. Arbitrary selection of the wiring route inside each region is guaranteed by the definition of the rectangular region but in practise, the wiring route is determined in consideration of the wiring length and the layout rule. Incidentally, though the start terminal S and the end terminal T are represented by points, they nay be lines or their set.

FIG. 10B shows an example of the detailed route determination inside the rectangles.

In the drawing, the lines l1 and l5 are determined uniquely because they pass through the terminals S and T. The lines l2 and l4 are determined by the wiring length of the net as a whole and by the through-hole condition having the same potential as the net. For, when the final determination pattern shown in FIG. 10C is assumed, W1 and W4 are preferably as small as possible in order to reduce the wiring length. At this time, they may be set to W1=W4=0 if there is no limitation but in the case of this embodiment, the through-hole adjacence condition having the same potential must be satisfied. When, for example, the through-holes TH1 and TH2 exist adjacent to each other as shown in FIG. 10C, their distance δ must be not less than a predetermined distance ($\delta_0$) in accordance with the layout rule due to the limitation of process and machining. Accordingly, the distance δ between the lines l2 and l4 must satisfy the following relation:

$$\delta = L + W1 + W4 > \delta_0$$

In this manner, the values of W1 and W2 are determined. If $L > \delta_0$, they may be W1=W2=0.

Figure 11A:
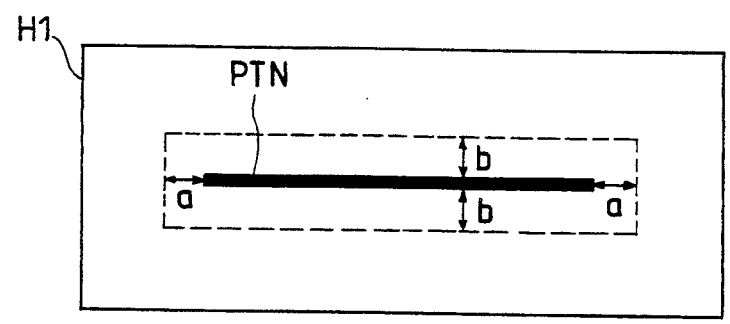
FIGS. 11A to 11C are explanatory views of a re-division method for the rectangular regions after the determination of the detailed wiring routes.
Figure 11B:
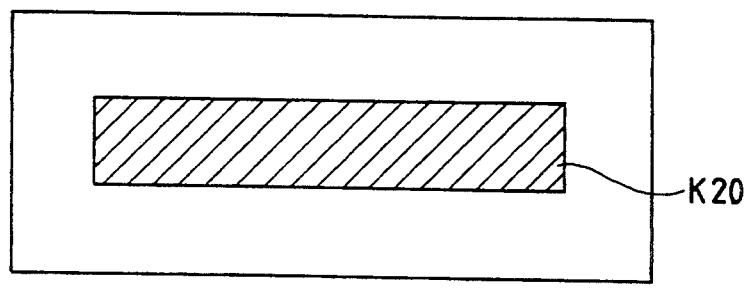
Figure 11C:
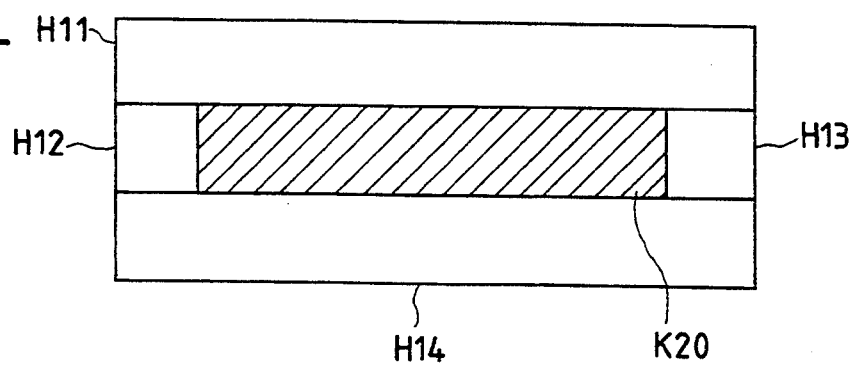

FIGS. 11A to 11C show an example of the method of re-dividing the rectangular region after the detailed wiring route is determined inside the rectangular region.

When the wiring pattern PTN is determined inside the rectangular region H1 as shown in FIG. 11A, for example, another wiring pattern cannot be disposed around this wiring pattern PTN in accordance with the adjacence rule of conductive patterns unless a predetermined distance is secured around the wiring pattern PTN. In this explanation, the distance in the vertical direction is represented by b and the distance in the horizontal direction, by a, and other conductive patterns such as the wirings and through-holes are not to be disposed inside the region determined in this manner. Accordingly, this range is substantially the wiring inhibiting range and the wiring inhibiting region K20 is set inside the rectangular region H1 as shown in FIG. 11B. Here, to what values the limit values a and b described above are to be set are determined at least in accordance with the layout rule but in the case of this embodiment wherein the rectangular regions are defined to cross one another even when parts of them overlap at the sides, it is preferred to define the peripheral side portions of the wiring inhibiting regions as the "wirable regions" so as to establish consistency with the above definition. In this embodiment, therefore, the limit values a and b described above are determined so as to permit wirings at the peripheral edge portions of the wiring inhibiting region, though this determination is not particularly limitative.

After the wiring inhibiting region K20 is set inside the rectangular region H1, re-division is made for the remaining wirable regions as shown in FIG. 11C and the rectangular region H1 is updated to rectangular regions H11, H12, H13 and H14.

Next, the case where wiring route search processing is executed in parallel for a plurality of wiring object nets will be explained.

Basically, in order to make such a processing, the search of rectangular regions may be carried out on the premise that the rectangular regions to be selected by the search have a width greater than a predetermined width in which the wirings for connecting a plurality of sets of object terminals can be juxtaposed.

Figure 12A:
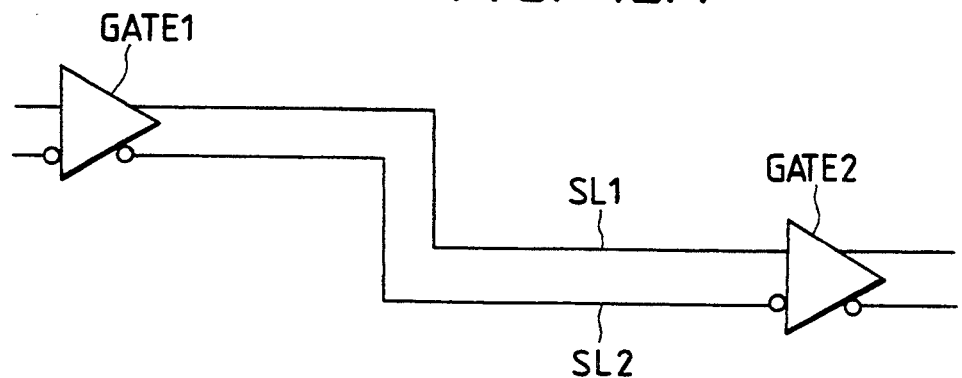
FIGS. 12A to 12C are explanatory views relating to a parallel wiring route determination method with respect to differential signal lines.
Figure 12B:
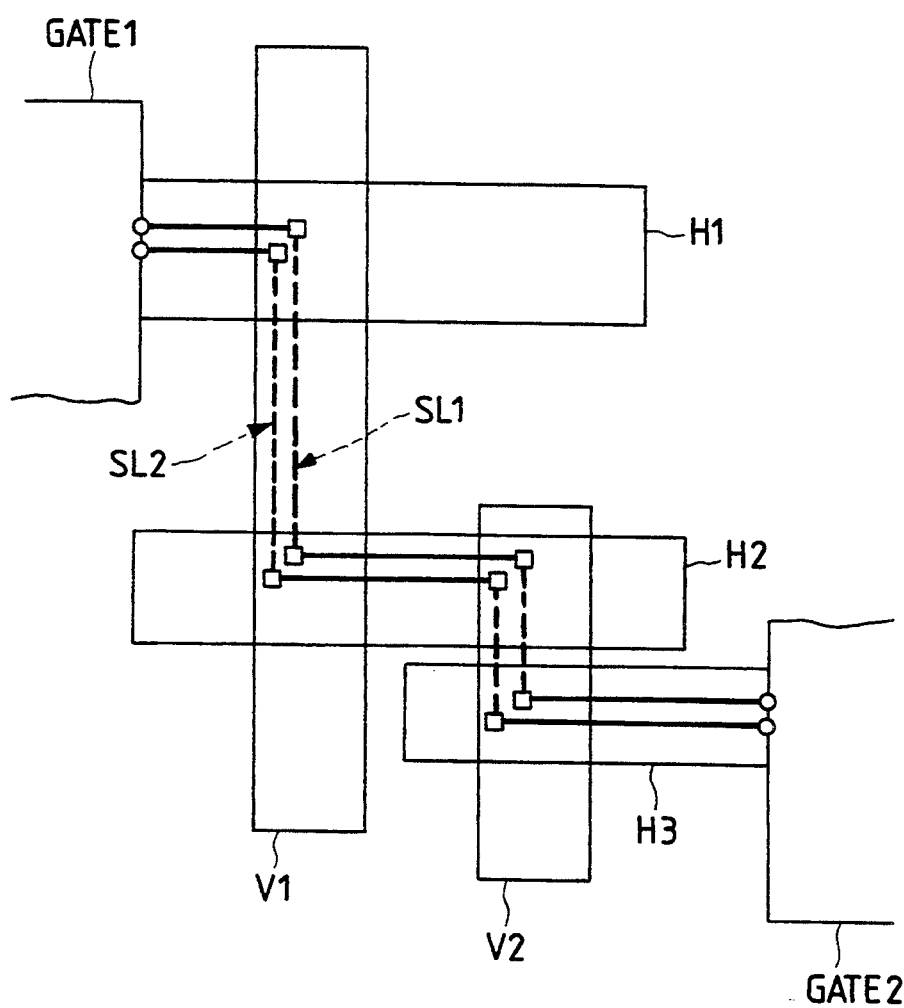

FIG. 12A shows an example of pair wirings of a differential circuit. In the drawing, the output terminal of the differential circuit GATE1 is connected to the input terminal of the next stage differential circuit GATE2 by complementary signal lines or differential signal lines SL1, SL2 as the pair wirings. Substantial signal transmission speed can be improved by use of such differential signal lines but for that purpose, the delay components such as resistance and capacity in the differential signal lines SL1, SL2 must be made equal to one another. Accordingly, the differential signal lines SL1, SL2 must generally be wired in parallel and with an equal distance. Such wiring routes are searched automatically in the following way. As shown in FIG. 12B, a rectangular region having a width in which at least two wiring patterns can be juxtaposed is searched and the pair wiring routes are set inside the rectangular region thus searched. Condition setting for the width of the rectangular region as the search object may be calculated by using such a function that makes the evaluation value described with reference to FIG. 8A infinite when the width of the rectangular region is below a predetermined value.

Figure 12C:
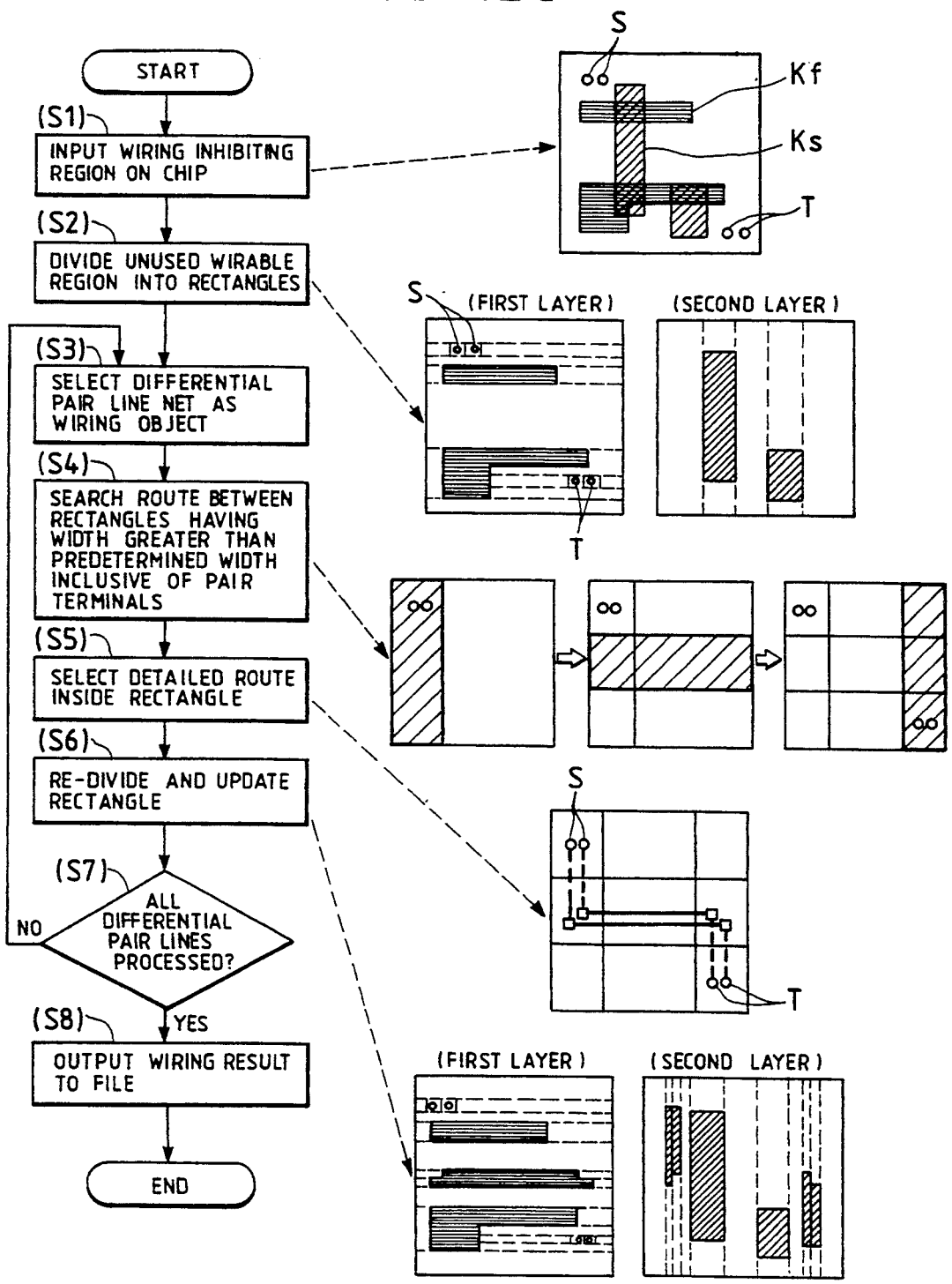

FIG. 12C shows an example of the wiring route determination sequence of the differential signal lines SL1, SL2 described above. This processing sequence is basically the same as the sequence which is explained with reference to FIG. 3. The differences reside in that the differential signal line net is selected (Step S3) as the wiring object net, the width of the rectangle as the search object is limited to be above a predetermined width when the route between the rectangles containing the selected differential signal line net terminal is searched (Step S4), and the differential signal lines are juxtaposed inside the searched rectangular region (Step S5).

Figure 13:
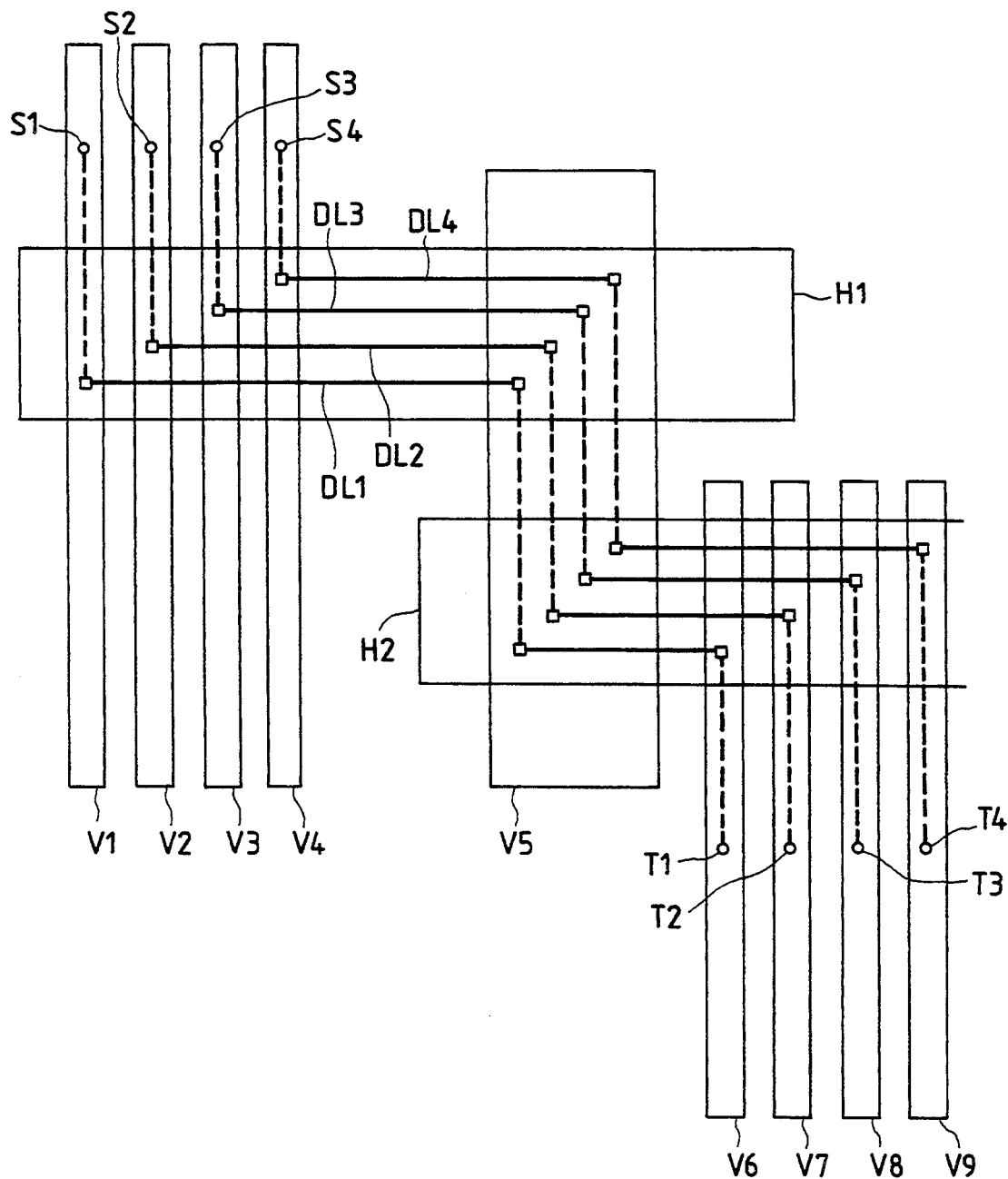
FIG. 13 is an explanatory view of the parallel wiring routes with respect to bus signal lines.

FIG. 13 shows the bus signal lines as an example of the pair wirings. In the drawing, DL1 to DL4 represent four data lines, which connect the mutually corresponding nets (S1, T1), (S2, T2), (S3, T3) and (S4, T4). In the case of the bus signal lines, it is difficult from the aspect of layout to establish complete parallelism for all their routes and practically, they are dispersed to a certain extent. However, it is preferred from the view point of circuit operation or characteristics to set them parallel as much as possible or bundle them to provide the same wiring lengths as much as possible. In accordance with the example shown in FIG. 13, the terminals S1~S4 are contained in the vertical rectangular regions V1~V4 capable of forming at least one wiring layer, respectively, and the terminals T1~T4 are contained in the vertical rectangular regions V6~V9 capable of forming at least one wiring layer, respectively. This arrangement assumes the case where four wirings cannot be made parallel in one rectangular region due to the individual positions of the terminals S1 to S4 and T1 to T4 and relation with the other circuit patterns. In the routes for connecting the vertical rectangular regions V1 to V4 and the longitudinal rectangeular regions V6 to V9, the search result of the rectangular regions H1, V5, H2 having a width capable of making at least four wirings parallel is shown.

FIG. 14A shows an example of the method of searching the wiring route which makes parallel at least part of the bus signal lines.

The method shown in FIG. 14A represents an example where the wiring object nets exist in n sets. S1 to Sn are the start terminals and T1 to Tn are the end terminals. The search for the wiring routes for the wiring object nets is carried out in the following sequence.

① Step P1

All the rectangular regions having widths greater than the width j which can be connected at a level below level i are searched from the start terminal S1. The search of the rectangular regions is carried out similarly for the start terminals S2 to Sn. Here, the level i can be defined as the number of rectangles or the number of bents of rectangles. The width j can be defined as the number of wiring routing grids or the number of grids as a reference. Practical values are given to i and j described above.

② Step P2

One rectangular region which is common for each group is selected from the rectangular region group searched in accordance with each terminal at the step P1, and is defined as the rectangular region Hs or Vs.

③ Step P3

All the rectangular regions having a width greater than the width j which can be connected at the level k are searched from the end terminal T1. The rectangular regions are searched similarly for the end terminals T2 to Tn. Here, the level k can be defined as the number of rectangles or the number of bents of rectangles.

④ Step P4

One rectangular region which is common for each group is selected from the group of the rectangular regions searched for each end terminal at the step P3 and is defined as the rectangular region Ht or Vt.

⑤ Step P5

Figure 14B:
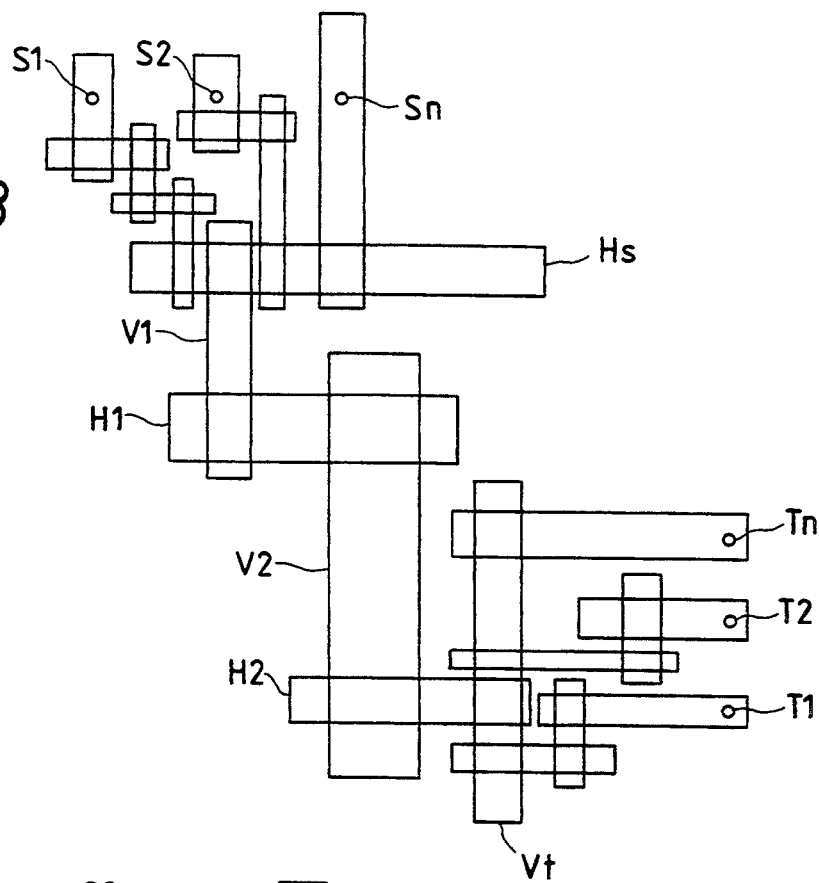

The routes of the rectangular regions having a width greater than the width m (where m means the number of routing grids or the number of other routing grids for representing the width in which n wirings can be juxtaposed) are searched between the rectangular region Vs or Hs and the rectangular region Vt or Ht. The whole example of the rectangular regions searched by conducting the steps P1 to P5 is shown in FIG. 14B and the rectangular regions are V1, H1, V2 and H2.

⑥ Step 6

Figure 14C:
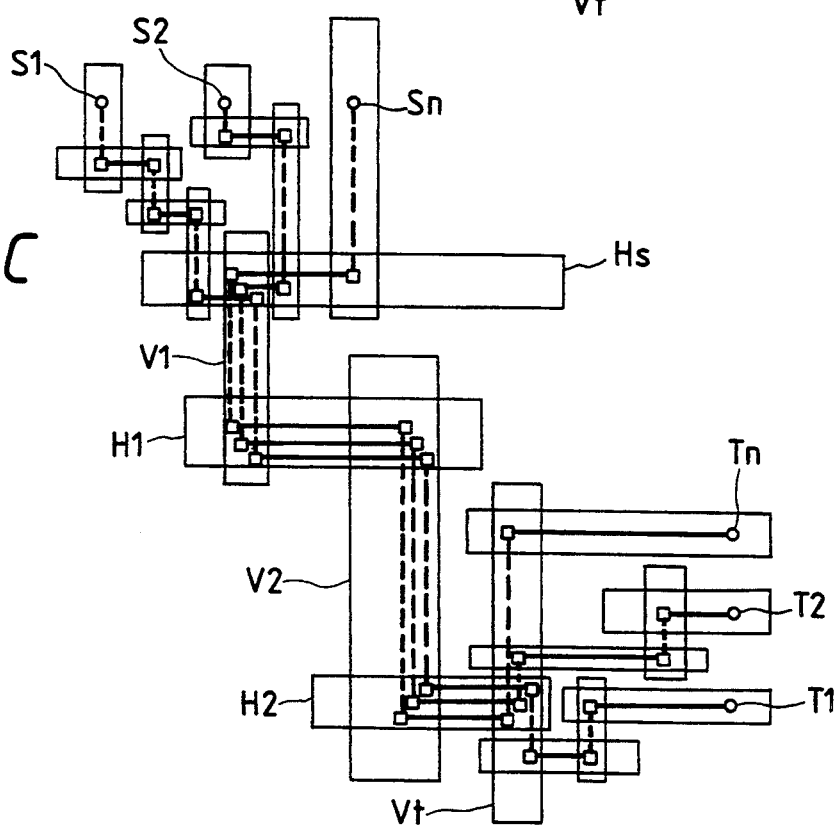
Figure 15:
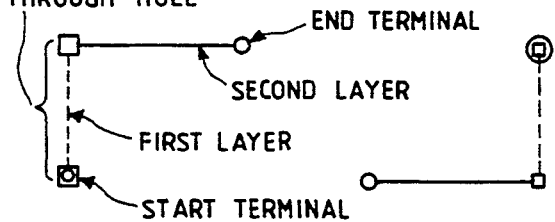
FIG. 15 is an explanatory view relating to a pattern limitation method, a maze routing method, a line search method and a channel assignment method in accordance with the prior art.
Figure 16A:
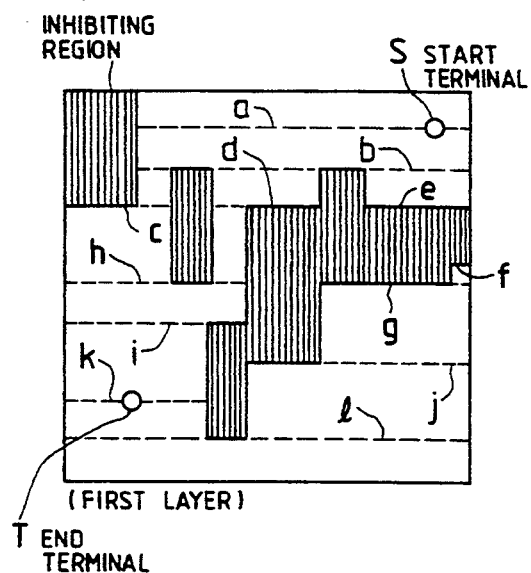
FIGS. 16A to 16D are explanatory views of a conventional method for searching the wiring routes using the sides of rectangles as elements.
Figure 16B:
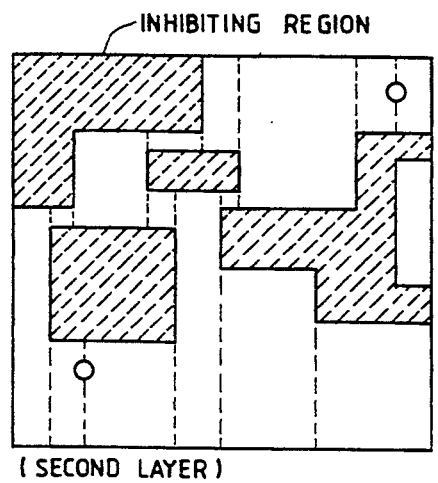
Figure 16C:
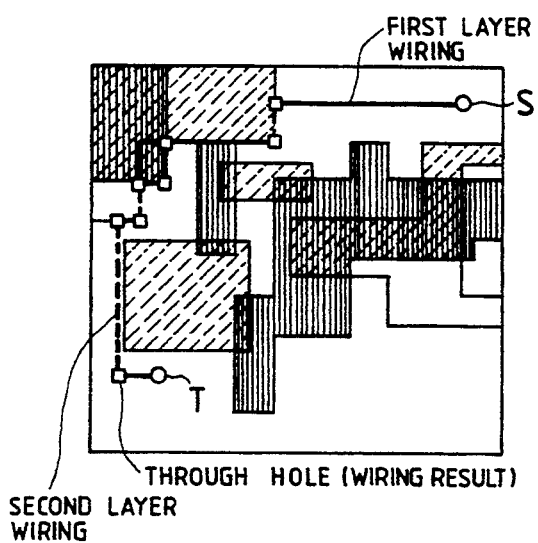
Figure 16E:
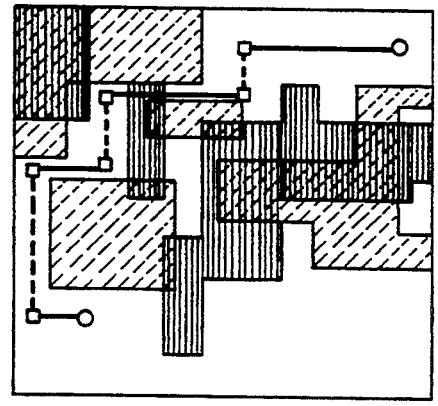
FIGS. 16E and 16F are explanatory views useful for explaining the wiring routes.
Figure 16D:
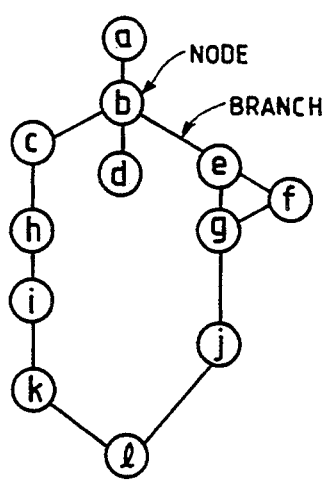
Figure 16F:
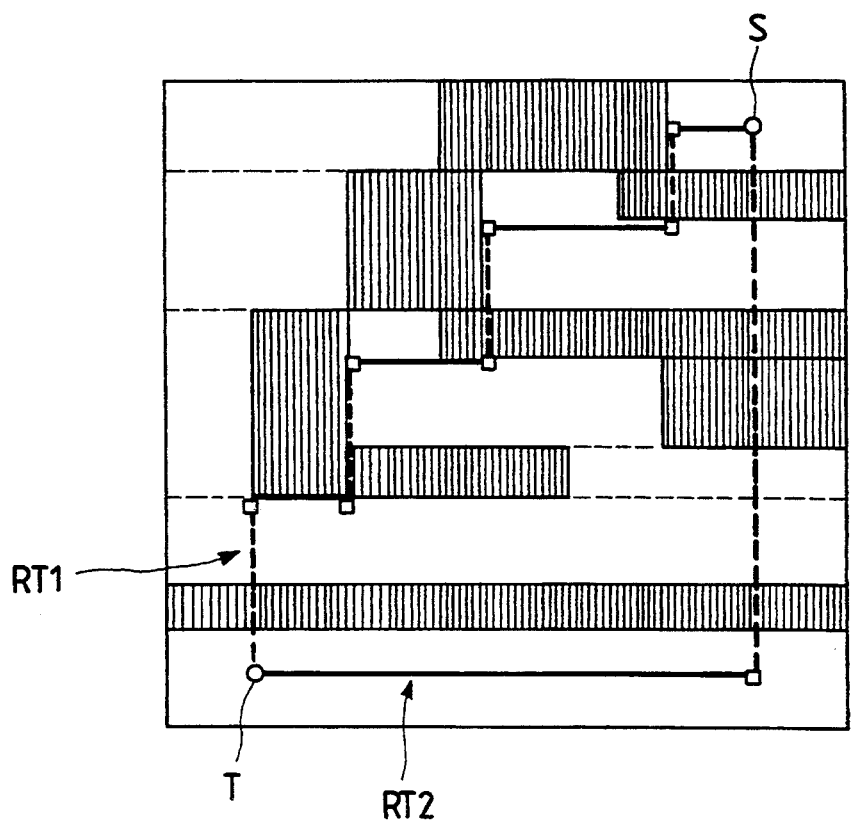

The detailed wiring routes between the object nets are determined inside the rectangular region searched in the manner described above. An example of the detailed wirings thus determined is shown in FIG. 14C.

The embodiment described above provides the following function and effect.

(1) In the layout of the semiconductor integrated circuit device, automatic wiring processing of the wiring object nets is made by carrying out the step of dividing a wirable region into a plurality of rectangular regions for each wiring layer, the step of searching the rectangular regions for rotating the rectangular regions crossing one another between the mutually adjacent wiring layers and connecting terminals to be connected, and the step of determining the detailed wiring routes inside the searched rectangular region.

According to the item (1) described above, the following effects can be obtained.

① Since the wiring route is searched on a rectangle basis, processing speed can be made higher than the route search on a routing grid or line basis. For example, a processing speed which is several tens times higher than that of the maze routing and which is ten and several times higher than that of the line search method can be expected.

② The search is made by routing the mutually crossing rectangular regions without taking the wiring routing grids into particular consideration. Accordingly, the present invention can be applied easily to multi-layer interconnection (interconnection of 3 to 5 layers or more, for example) without expanding the algorithm, in particular. The invention can cope easily with various models in which the routing grid gap between the wirings or the wiring width is variable, and can be applied easily to the model having the wiring inhibiting regions having arbitrary shapes.

③ In the invention, the rectangular region for connecting the object terminals is searched by routing the mutually crossing rectangular regions. Therefore, it is only necessary to store at least the data for specifying the rectangular region itself in the main memory of the computer (inclusive of the work region), and it is not particularly necessary to store the data of the branches representing the connection between the rectangular regions with one another. In this manner, the memory capacity for the work region of the computer necessary for the route search processing can be reduced.

(2) The rectangular regions which are set in the wirable regions are defined as two type of regions; the horizontal rectangular regions permitting the wirings in the horizontal direction and the vertical rectangular regions permitting the wirings in the vertical direction. Accordingly, the processing algorithm in the wiring processing system can be simplified and adaptability to diversification of the number of wiring layers can be further improved.

(3) When the detailed wiring region is determined in the searched rectangular region, the wiring region is expanded in such a manner as to satisfy the adjacent layout rule or the like between it and other wiring regions and the division step of the rectangular region is executed anew using it as the wiring inhibiting region. Accordingly, consistency of processing can be established between the processing rule when the rectangular regions cross one another at the boundary portions and the processing rule at the boundary portions when the wiring inhibiting region and the rectangular region are in mutual contact at the boundary portion. In other words, it is possible to employ the mutually consistent rules which permit setting of the wiring route at the boundary even when the peripheral edge portions of at least two rectangular regions are in contact and cross one another and permit setting of the wiring route at the boundary when the wiring inhibiting region and the rectangular region are in contact with each other at the edge side portion, respectively.

(4) When another rectangular region crossing one rectangular region is selected, the above rectangular region search step includes also the step of calculating the evaluation value G using the distance to the target terminal, the detour distance to the target terminal and the width of the rectangular region as the parameters and the step of judging the evaluation value involving a smaller distance, smaller detour distance to the target terminal and a greater width of the rectangular region as the parameters to be more preferential and selecting a rectangular region so that the object terminal can be reached by preferentially using a rectangular region having higher priority evaluation value, so that the number of bents of the wiring routes can be reduced and the route search processing speed can be improved. Since the number of bents of the wiring routes can thus be reduced, the number of contact holes decreases and this contributes to improving the yield of the semiconductor integrated circuit devices.

(5) The list structure using the coordinates data as an index key is employed as the system for storing the definition data of the rectangular regions in the main memory. Accordingly, that capacity for storing such data of the main memory which would otherwise be used as the work region of the computer can be further reduced.

(6) The requirement for a rectangular region to be selected by the search to have a width greater than the predetermined width which permits parallel disposition of the wirings for connecting a plurality of sets of terminals to be wired is included in the search condition. In this manner, the search of the pair wirings such as the differential signal lines of the differential circuit and the bus signal lines can be made efficiently and wiring lengths can be made uniform easily.

(7) In the semiconductor integrated circuit devices having the physical wiring pattern formed by the automatic wiring processing system employing the wiring techniques described above, the wiring length is shorter and the number of bents decreases, so that the number of contact holes decreases, and since the wiring lengths of the pair signal lines can be made the same, operational and structural reliability can be improved.

Although the present invention has thus been described in details with reference to its embodiment, the present invention is not particularly limited thereto but can of course be changed or modified in various manners without departing from the scope thereof.

For example, the example shown in FIG. 3 represents the case where re-division of the rectangular region is made whenever one wiring object net is processed, but it may be made for each processing of a plurality of nets as has been explained about the method of the pair signal wirings. In this manner, the overall processing speed can be further improved.

The method of definition and kinds of the rectangular region and the crossing condition between the rectangular regions are not limited to those of the embodiment described above but can be changed in suitable manners.

As to the through-hole inhibiting region, the present invention is not particularly limited to the method which defines in advance the wiring inhibiting region and refers to the region in the division processing of the rectangular region, but can employ the method which stores the through-hole inhibiting regions in a separate table and checks it at the time of determination of the detailed wiring routes inside the rectangular region.

Functions of the evaluation value described above is not limited to those of the embodiment described above and the kinds of the parameters to be referred to can be changed appropriately.

Although the invention completed by the present inventor describes its application to the layout technique of the semiconductor integrated circuit as a field of utilization of the invention, the present invention is not particularly limited thereto but can be applied widely to the wiring route determination method for a mounting or wiring substrate.

Among the effects brought forth by the present application, the effects obtained by the typical invention are as follows.

A route is in advance searched at the level of rectangle divided in an unused wirable region, and then the detailed wiring route is determined inside the searched rectangular region. In this manner, the wiring route is first searched using the rectangle as a unit. Accordingly, there can be obtained the effect that the processing speed can be made higher than for route search using the wire routing grid and the line as a unit.

Since the search can be made by tracing the mutually crossing rectangular regions without taking the wire routing grid into particular consideration, the present invention can cope easily with a multi-layer interconnection model, a model wherein the wire routing grid gap and wiring width are variable and a model having a wiring inhibiting region in an arbitrary shape.

Since the rectangular region for connecting the object terminals is searched by tracing the crossing rectangular regions, it is only necessary to store at least the data for specifying the rectangular region itself in the work region of the computer but it is not essentially necessary to store the data on the branches representing the connection between the rectangular regions. Thus, the memory capacity for the work region of the computer necessary for the route search processing can be reduced.

When the rectangular regions are searched, the selection of the crossing rectangular regions is carried out by utilizing priority of the evaluation values which take the parameters such as the distance to the object terminals and the width of the rectangular regions into consideration. Accordingly, the wirings having a reduced number of bents can be obtained easily and eventually, the yield of the semiconductor circuit devices can be improved.

Parallel search processing of the wiring routes for a plurality of nets can be made by including the width of the rectangular regions in the evaluation values described above. Accordingly, the wiring route can be searched efficiently for the pair wirings such as the differential signal lines of a differential circuit and bus signal lines and the wiring lengths can be made uniform easily.

The rectangular region set in the wirable region is defined in two ways; the horizontal rectangular region where wirings in the horizontal direction are permitted and the vertical rectangular region where wirings in the vertical direction are permitted. Accordingly, the algorithm of the processing in the wiring processing method can be simplified or adaptability to diversification of the number of the wiring layers can be further improved.

When the detailed wiring region is determined inside the searched rectangular region, the wiring region is expanded in such a manner as to satisfy the adjacent layout rule of the wiring region or the conductive regions and the division step of the rectangular region is executed anew by using the expanded region as the wiring inhibiting region. In this manner, consistency of processing can be established between the processing rule when the rectangular regions cross mutually at the boundary portions and the processing rule at the boundary portions when the wiring inhibiting regions and the rectangular regions come into mutual contact at the boundary portions.

The semiconductor integrated circuit device containing the physical wiring pattern formed by the automatic wiring processing system employing the wiring method described above provides a short wiring length and a small number of bents. Therefore, the number of contact holes can be reduced and furthermore, since the wiring lengths of the pair signal lines can be made uniform, operational and structural reliability can be improved.

What is claimed is:

1. A wiring method for connecting terminals in a virtual region by wiring routes in a plurality of wiring layers, comprising:
   a division step of dividing a wirable region in each of said plurality of layers into a plurality of rectangular regions, each having a width capable of containing at least one wiring route;
   a search step of searching rectangular regions for forming a route for connecting said terminals from among said plurality of rectangular regions in said plurality of layers, each of said searched rectangular regions having a part overlapping with another searched rectangular region from another one of the plurality of layers;
   a wiring route determination step of determining said wiring route for connecting said terminals inside said searched rectangular region;
   a generating step of generating through holes within the route of rectangular regions in areas of overlap between the searched rectangular regions, at positions where wiring route portions located on different wirable regions cross, such that the crossing wiring route portions are connected by the generated through holes; and
   a connecting step of connecting said terminals via the wiring route determined by the wiring route determination step.

2. A wiring method according to claim 1, wherein said division step includes:
   a step of dividing said wirable region in one of said layers in a predetermined direction; and
   a step of dividing a wirable region in a layer adjacent to said one layer in a direction crossing said predetermined direction.

3. A wiring method according to claim 2, wherein said search step includes:
   a step of searching a rectangular region for connecting said terminals by tracing mutually crossing rectangular regions.

4. A wiring method according to claim 3, which further comprises:
   an updating step of removing said wiring route determined by said wiring route determination step from one of said searched rectangular regions and updating said one rectangular region.

5. A wiring method according to claim 1, wherein said rectangular regions in one of said plurality of layers are defined as horizontal rectangular regions in which wirings in only a horizontal direction are permitted and said rectangular regions in a layer adjacent to said one layer are defined as vertical rectangular regions in which wirings in only a vertical direction are permitted.

6. The wiring method according to claim 5, wherein, when said wiring route is determined within said route of rectangular regions, said wiring route is expanded in such a manner as to satisfy an adjacent layout rule of wirable regions, and a division step of said rectangular regions is executed anew by using said expanded wiring route as a wiring inhibiting region.

7. A wiring method according to claim 1, wherein said rectangular region search step includes:
   a step of calculating an evaluation value of a rectangular region being searched by use of a distance to an object terminal, a detour distance to the object terminal and a width of the rectangular region being searched as parameters;
   comparing a plurality of evaluation values of a plurality of searched rectangular regions, wherein an evaluation value representing a smaller distance to the object terminal, a smaller detour distance to the object terminal and a greater width is preferred; and
   selecting the rectangular region having the most preferred evaluation value.

8. A wiring method according to claim 1 further including automating implementation of the wiring method on a computer.

9. A wiring route processing method according to claim 1, further comprising a connection determining a connection portion within the overlapping part to connect between wiring routes.

10. A wiring method for connecting a first terminal and a second terminal in a virtual region by a wiring route formed in at least a first wiring layer and a second wiring layer insulated from each other, the method comprising:
   dividing a wirable region in the first wiring layer into a plurality of first layer rectangular regions;

dividing a wirable region in the second wiring layer into a plurality of second layer rectangular regions;

searching from among the first layer rectangular regions and the second layer rectangular regions to select a route from the first terminal to the second terminal, the route including selected first layer rectangular regions and second layer rectangular regions, each of the selected first layer and second layer rectangular regions having a part overlapping with another one of the selected rectangular regions;

determining a wiring route for connecting the first terminal and the second terminal inside the route of rectangular regions, a first portion of the wiring route crossing a second portion of the wiring route in one of the overlapping areas of the selected rectangular regions;

generating a through hole in the insulation layer between the first and the second wiring layers to connect the first and second portions of the wiring route at the crossing; and connecting the first terminal and second terminal via the wiring route determining step and the through hole generating step.

11. The wiring method according to claim 10 further including dividing the first wiring layer into a plurality of horizontal rectangular regions; and dividing the wirable region in the second wiring layer into a plurality of vertical rectangular regions.

12. The wiring method according to claim 10, further including a step of calculating an evaluation value of a rectangular region being searched by use of a distance to the second terminal, a detour distance to the second terminal and a width of the rectangular region being searched as parameters;

comparing a plurality of evaluation values of a plurality of searched rectangular regions, wherein an evaluation value representing a smaller distance to the second terminal, a smaller detour distance to the second terminal and a greater width is preferred; and selecting the rectangular region with the most preferred evaluation value.

13. A wiring method for connecting terminals in a virtual region by wiring routes in a plurality of wiring layers, the method comprising:

obtaining coordinates of a first wirable region of a first layer of the virtual region and of a second wirable region of a second layer of the virtual region;

dividing the first wirable region of the first layer into a plurality of horizontal rectangular regions using the obtained coordinates;

dividing the second wirable region of the second layer into a plurality of vertical rectangular regions using the obtained coordinates;

selecting an object net which includes a first terminal and a second terminal to be connected, the first terminal and second terminal each located within one of the horizontal and vertical rectangular regions;

determining in which of the rectangular regions the first terminal is located;

searching the rectangular regions to form a route of rectangular regions from the first terminal to the second terminal, each of the rectangular regions of the route overlapping another rectangular region of the route, the overlapped rectangular regions being in different wiring layers;

after formation of the rectangular region route, determining detailed wiring routes within the rectangular region route, the detailed wiring routes including wiring route portions;

generating through holes within the rectangular region route in overlapping areas where wiring route portions in different wiring layers cross, the crossing wiring route portions are connected by the generated through holes; and connecting said terminals via the wiring route determined by the detailed wiring route determination step and the through hole generating step.

14. A wiring method according to claim 13, wherein said rectangular region search step further includes a search condition that said rectangular region to be selected by the search has a width greater than a predetermined width capable of juxtaposing wirings for connecting a plurality of sets of terminals to be wired.

15. A wiring method according to claim 13 the determining step includes determining detailed parallel wiring routes within the searched rectangular regions, for connecting parallel terminals.

16. The wiring method according to claim 13 further including a step of calculating an evaluation value by use of a distance to the second terminal, a detour distance to the second terminal and a width of a rectangular region being searched as parameters to obtain the evaluation value;

comparing a plurality of evaluation values of a plurality of searched rectangular regions, wherein an evaluation value representing a smaller distance to the second terminal, a smaller detour distance to the second terminal and a greater width is preferred; and selecting the rectangular region with the most preferred evaluation value.

17. The wiring method according to claim 13 wherein the step of generating through holes includes arbitrarily selecting a location in the overlapped section for the formation of the through holes.

18. The wiring method according to claim 13 wherein the first wiring route portions which cross one another include a first wiring route portion in a horizontal rectangular region and a second wiring route portion in a vertical rectangular region.

* * * * *

UNITED STATES PATENT AND TRADEMARK OFFICE
CERTIFICATE OF CORRECTION

PATENT NO. : 5,375,069
DATED : December 20, 1994
INVENTOR(S) : Yasuo Satoh, et al.

It is certified that error appears in the above-indentified patent and that said Letters Patent is hereby corrected as shown below:

TITLE PAGE ITEM,

[30] Foreign Application Priority Data Should Read

-- December 18, 1989 [JP] Japan .............. 1-327746 --

Claim 15, column 20, line 30, before "the" insert --wherein--.

Signed and Sealed this

Twenty-first Day of February, 1995

Attest:

BRUCE LEHMAN

Attesting Officer     Commissioner of Patents and Trademarks